US006906644B2

(12) United States Patent
Satoh

(10) Patent No.: US 6,906,644 B2
(45) Date of Patent: Jun. 14, 2005

(54) ENCODING AND DECODING APPARATUS WITH MATCHING LENGTH MEANS FOR SYMBOL STRINGS

(75) Inventor: Noriko Satoh, Kanagawa (JP)

(73) Assignee: Fujitsu Limited, Kawasaki (JP)

(*) Notice: Subject to any disclaimer, the term of this patent is extended or adjusted under 35 U.S.C. 154(b) by 141 days.

(21) Appl. No.: 10/226,187

(22) Filed: Aug. 23, 2002

(65) Prior Publication Data

US 2002/0190877 A1 Dec. 19, 2002

Related U.S. Application Data

(62) Division of application No. 09/950,783, filed on Sep. 13, 2001, which is a division of application No. 09/372,040, filed on Aug. 11, 1999, now Pat. No. 6,320,522.

(30) Foreign Application Priority Data

Aug. 13, 1998 (JP) .......................................... 10-229094
Feb. 26, 1999 (JP) .......................................... 11-050500

(51) Int. Cl.[7] ............................ H03M 7/34; H03M 7/38
(52) U.S. Cl. ............................................ 341/51; 341/67
(58) Field of Search .............................. 341/51, 87, 106, 341/67, 5; 382/232; 708/203; 707/101

(56) References Cited

U.S. PATENT DOCUMENTS

| 5,001,478 A | | 3/1991 | Nagy | |
|---|---|---|---|---|
| 5,371,499 A | * | 12/1994 | Graybill et al. ................ | 341/51 |
| 5,406,278 A | | 4/1995 | Graybill et al. ................ | 341/51 |
| 5,424,732 A | | 6/1995 | Iyer et al. | |
| 5,506,580 A | * | 4/1996 | Whiting et al. ................ | 341/51 |
| 5,525,982 A | | 6/1996 | Cheng et al. .................. | 341/51 |
| 5,608,396 A | | 3/1997 | Cheng et al. | |
| 5,621,403 A | | 4/1997 | Reznik | |
| 5,640,158 A | * | 6/1997 | Okayama et al. .............. | 341/51 |
| 5,673,042 A | | 9/1997 | Yoshida et al. | |
| 5,701,468 A | | 12/1997 | Benayoun et al. ........... | 707/101 |
| 5,812,076 A | | 9/1998 | Yoshida | |
| 5,825,315 A | | 10/1998 | Murashita et al. | |
| 5,883,588 A | * | 3/1999 | Okamura ........................ | 341/5 |
| 6,226,628 B1 | | 5/2001 | Forbes ........................... | 707/1 |
| 6,262,675 B1 | | 7/2001 | Iyer ............................... | 341/51 |
| 6,320,522 B1 | | 11/2001 | Satoh | |
| 6,515,598 B2 | | 2/2003 | Parenteau et al. ............ | 341/60 |
| 6,549,148 B2 | | 4/2003 | Satoh ............................ | 341/51 |
| 6,624,762 B1 | * | 9/2003 | End, III ........................ | 341/51 |

FOREIGN PATENT DOCUMENTS

| JP | 5-241776 | 9/1993 |
|---|---|---|
| JP | 7-261977 | 10/1995 |
| JP | 8-065172 | 3/1996 |

OTHER PUBLICATIONS

U.S. Appl. No. 10/226,291, filed Aug. 23, 2002, Noriko Satoh.
U.S. Appl. No. 10/226,292, filed Aug. 23, 2002, Noriko Satoh.
Tomohiko Uematsu, "Introduction to Document Data Compression Algorithm," pp. 131–173, Oct. 15, 1994.
"Notice of Rejection Grounds" for the corresponding Japanese Patent Application No. H11–050500 dispatched on Sep. 2, 2003.

* cited by examiner

*Primary Examiner*—Patrick Wamsley
(74) *Attorney, Agent, or Firm*—Staas & Halsey LLP

(57) ABSTRACT

A symbol string detection unit detects the second symbol string matching the first symbol string having a predetermined length n from input character strings. A matching length detection unit detects a matching length k between the third symbol string following the first symbol string and the fourth symbol string following the second symbol string. A coding unit codes an input symbol string based on the symbol string detected by the symbol string detection unit and the matching length k detected by the matching length detection unit.

6 Claims, 26 Drawing Sheets

ENCODING AND DECODING APPARATUS WITH MATCHING LENGTH MEANS FOR SYMBOL STRINGS

This application is a Divisional Application of application Ser. No. 09/950,783, filed Sep. 13, 2001, now pending, which is Divisional application of application Ser. No. 09,372,040, filed Aug. 11, 1999 now patented as U.S. Pat. No. 6,320,522.

BACKGROUND OF THE INVENTION

1. Field of the Invention

The present invention relates to a coding apparatus and a decoding apparatus which can be optimally applied in compressing and reconstructing various data such as CAD data, document data, etc.

2. Description of the Related Art

Recently, an increasing volume of various types of data such as character codes, image data, etc. have been processed in a computer. When such large volume of data is stored and transmitted to a distant destination, it is common to compress the data with the redundant portion of the data removed to reduce the storage capacity and improve the transmission speed.

There are two common data compressing systems. They are a dictionary type coding system based on the similarity in data sequences; and a probability statistic type coding system based on the frequency of occurrences of data strings.

A typical example of the dictionary type coding system is an LZ77 system and an LZ78 system.

In the LZ77 system, a predetermined buffer is provided, the position of the previous data matching in longest length is retrieved from the previously input data in the buffer, and the matching position and the matching length are used as codes.

FIG. 1 shows the coding method in the conventional LZ77 system.

In FIG. 1, assume that 'a b a b c d e f a b c d e f g h . . . ' is input as data to be compressed, and each character of the data to be compressed is assigned an input number indicating an occurrence position.

First, if 'a' having the input number 1 is input, then the character 'a' is coded as is because it has no preceding characters. Then, when a character 'b' having the input number 2 is input, it is compared with the previously input characters. However, there are no characters matching the character 'b', the character 'b' is coded as is. Furthermore, when a character string 'a b' having the input numbers 3 and 4 is input, it is compared with the previously input character strings. As a result, since the character string matches a character string 'a b' having the input numbers 1 and 2, the character string 'a b' having the input numbers 3 and 4 is coded using the matching position and matching length. In this example, since the matching position is the position of the character 'a' having the input number 1, and the matching length is 2, '(1, 2)' is coded as the code of the character string 'a b' having the input numbers 3 and 4.

Next, when a character 'c' having the input number 5 is input, it does not match any of the previously input characters. Therefore, the character 'c' is coded as is. When a character 'd' having the input number 6 is input, it does not match any of the previously input characters. Therefore, the character 'd' is coded as is. When a character 'e' having the input number 7 is input, it does not match any of the previously input characters. Therefore, the character 'e' is coded as is. When a character 'f' having the input number 8 is input, it does not match any of the previously input characters. Therefore, the character 'f' is coded as is.

Then, when a character string 'a b c d e f' having the input numbers 9 through 14 is input, it matches a character string 'a b c d e f' having the input numbers 3 through 8. Therefore, the character string 'a b c d e f' having the input numbers 9 through 14 is coded using the matching position and the matching length. In this example, since the matching position is position of the character 'a' having the input number 3, and the matching length is 6, '(3, 6)' is coded as the code of the character string 'a b c d e f' having the input numbers 9 through 14.

When a character 'g' having the input number 15 is input, it does not match any of the previously input characters. Therefore, the character 'g' is coded as is. When a character 'h' having the input number 16 is input, it does not match any of the previously input characters. Therefore, the character 'h' is coded as is. On the other hand, in the LZ78 system, a previously input character string is entered in a dictionary, and an entered input number is coded.

The LZ77 system has higher compression performance than the LZ78 system for data containing a repetition of a long character string. On the other hand, the LZ78 system has higher compression performance than the LZ77 system for data containing a repetition of a comparatively short character string. The LZ77 system and the LZ78 system are described in, for example, the document "The Introduction to the Document Data Compression Algorithm" by Tomohiko Uematsu published by CQ Publishing Company.

A typical system of the probability statistic type coding system can be the arithmetic coding system and the Huffman coding system. Both arithmetic coding system and Huffman coding system obtain a compression effect by allotting a short code length to a character having a high occurrence probability according to the statistic occurrence frequency of each character The arithmetic coding system is described in, for example, the document "Arithmetic coding revisited" by Alister Moffat et al., 1995, IEEE Data Compression Conference, p 202–211. The Huffman coding system is described in, for example, the document "The Introduction to the Document Data Compression Algorithm" by Tomohiko Uematsu published by CQ Publishing Company.

To obtain a higher compression effect, a variable length coding method has been suggested based on the conditional occurrence probability ($P[Xt|xt-1]$) in which not the occurrence probability ($P(Xt)$) of a single character but the dependence (hereinafter referred to as a context) between an input character and its previous is taken into account. This method is described in, for example, the document "Unbounded Length Contexts for PPM" by John G. Cleary et al., 1995, IEEE Data Compression Conference, p 52–61.

The probability statistic type coding system as well as the LZ78 system has higher compression performance for data containing a repetition of a comparatively short character string. Normally, the LZ78 system has a higher processing speed than the probability statistic type coding system. On the other hand, the probability statistic type coding system has a higher compression rate than the LZ78 system.

However, the LZ78 system and the probability statistic type coding system have high compression rate for data containing a repetition of a comparatively short character string, but cannot have sufficient compression rate for data containing a repetition of a long character string.

On the other hand, the LZ77 system has high compression rate for data containing a repetition of a long character string, but cannot have sufficient compression rate for data containing a repetition of a comparatively short string.

Therefore, the conventional compression systems have difficulty in obtaining high compression rate for data containing a repetition of long character strings and comparatively short character strings.

The present invention aims at providing a data coding apparatus capable of efficiently compressing both long and short character strings.

SUMMARY OF THE INVENTION

To solve the above described problem, the present invention includes a symbol string detection unit for detecting a second symbol string matching a first symbol string having a predetermined length from an input symbol string; a matching length detection unit for detecting a matching length between a third symbol string following the first symbol string and a fourth symbol string following the second symbol string; and a coding unit for coding the input symbol string based on the symbol string detected by the symbol string detection unit and the matching length detected by the matching length detection unit.

Thus, for input data having a repetition of long symbol strings, a part of matching symbol string can be coded based on the matching length. Accordingly, the input data having a repetition of long symbol strings can be efficiently compressed. In addition, since a remaining portion of a matching symbol string is used as a code for use in detecting a matching position, the matching position can be detected without newly inserting a code for use in detecting the matching position. As a result, even when input data having a repetition of short symbol strings is coded using a matching length, the deterioration of a compression rate can be prevented from being caused by a large number of new codes inserted for detection of a matching position.

Furthermore, according to an aspect of the present invention, when a first symbol string matching a second symbol string having a predetermined length occurs, a third symbol string following the first symbol string is coded based on the matching length between the third symbol string and a fourth symbol string following the second symbol string. The portion not coded based on the matching length is coded using the code of a symbol immediately succeeding a symbol string which is a context.

Thus, for input data having a repetition of long symbol strings, a matching symbol string can be coded based on a matching string. Input data having a repetition of short symbol strings can be coded by allotting a shorter code length to a symbol string having a higher occurrence probability. As a result, a high compression rate can be attained for both data having a repetition of long symbol strings and data having a repetition of short symbol strings.

Furthermore, according to another aspect of the present invention, when a first symbol string matching a second symbol string having a predetermined length occurs, a third symbol string following the first symbol string is coded based on the matching length between the third symbol string and a fourth symbol string following the second symbol string. The portion not coded based on the matching length is coded by retrieving a coded word corresponding to the current symbol string from the dictionary in which the symbol strings occurred previously are entered in association with coded words.

Thus, for input data having a repetition of long symbol strings, a matching symbol string can be coded based on a matching string, and input data having a repetition of short symbol strings can be coded by the LZ 78 system. As a result, a high compression rate can be attained for both data having a repetition of long symbol strings and data having a repetition of short symbol strings.

According to a further aspect of the present invention, when a first symbol string matching a second symbol string having a predetermined length occurs, a third symbol string following the first symbol string is coded based on the matching length between the third symbol string and a fourth symbol string following the second symbol string. The data coded based on the matching length is further coded using the code of a symbol immediately succeeding a symbol string which is a context.

Thus, for input data having a repetition of long symbol strings, a matching symbol string can be coded based on the matching length. Accordingly, the input data having a repetition of long symbol strings can be efficiently compressed. In addition, when a short symbol string repeatedly occurs in compressed data coded based on a matching length, the compressed data coded based on the matching length can be furthermore compressed by allotting a short code length to a symbol string having a high occurrence probability, thereby attaining a high compression rate.

According to a further aspect of the present invention, when a first symbol string matching a second symbol string having a predetermined length occurs, a third symbol string following the first symbol string is coded based on the matching length between the third symbol string and a fourth symbol string following the second symbol string. The data coded based on the matching length is further coded by retrieving a coded word corresponding to the current symbol string from the dictionary in which the symbol strings occurred previously are entered in association with coded words.

Thus, for input data having a repetition of long symbol strings, a matching symbol string can be coded based on the matching length. Accordingly, the input data having a repetition of long symbol strings can be efficiently compressed. In addition, the compressed data coded based on the matching length can be further compressed by the LZ78 system. Therefore, a high compression rate can be attained for both data having a repetition of long symbol strings and data having a repetition of short symbol strings.

According to a further aspect of the present invention, the occurrence position of a symbol string which previously occurred is stored in association with a predetermined code, and it is checked whether or not a code corresponding to a symbol string immediately before a symbol string coded based on a matching length is stored, thereby detecting the occurrence position of a previous symbol string to be compared when the symbol string is coded based on the matching length.

Thus, when the occurrence position of the previous symbol string to be compared based on the matching length is checked, it is not necessary to check back one by one the previous symbol strings until a symbol string matching in a previous symbol string can be detected, thereby performing a process at a higher speed.

Furthermore, according to a further aspect of the present invention, when a matching length is shorter than a predetermined value, the symbol string is not coded based on the matching length.

Thus, when a matching length is short, the deterioration of a compression rate caused by adding a code indicating a matching length can be successfully avoided, thereby improving the compression rate in a coding process.

DETAILED DESCRIPTION OF THE PREFERRED EMBODIMENTS

The coding apparatus according to an embodiment of the present invention is described below by referring to the attached drawings.

Figure 1:
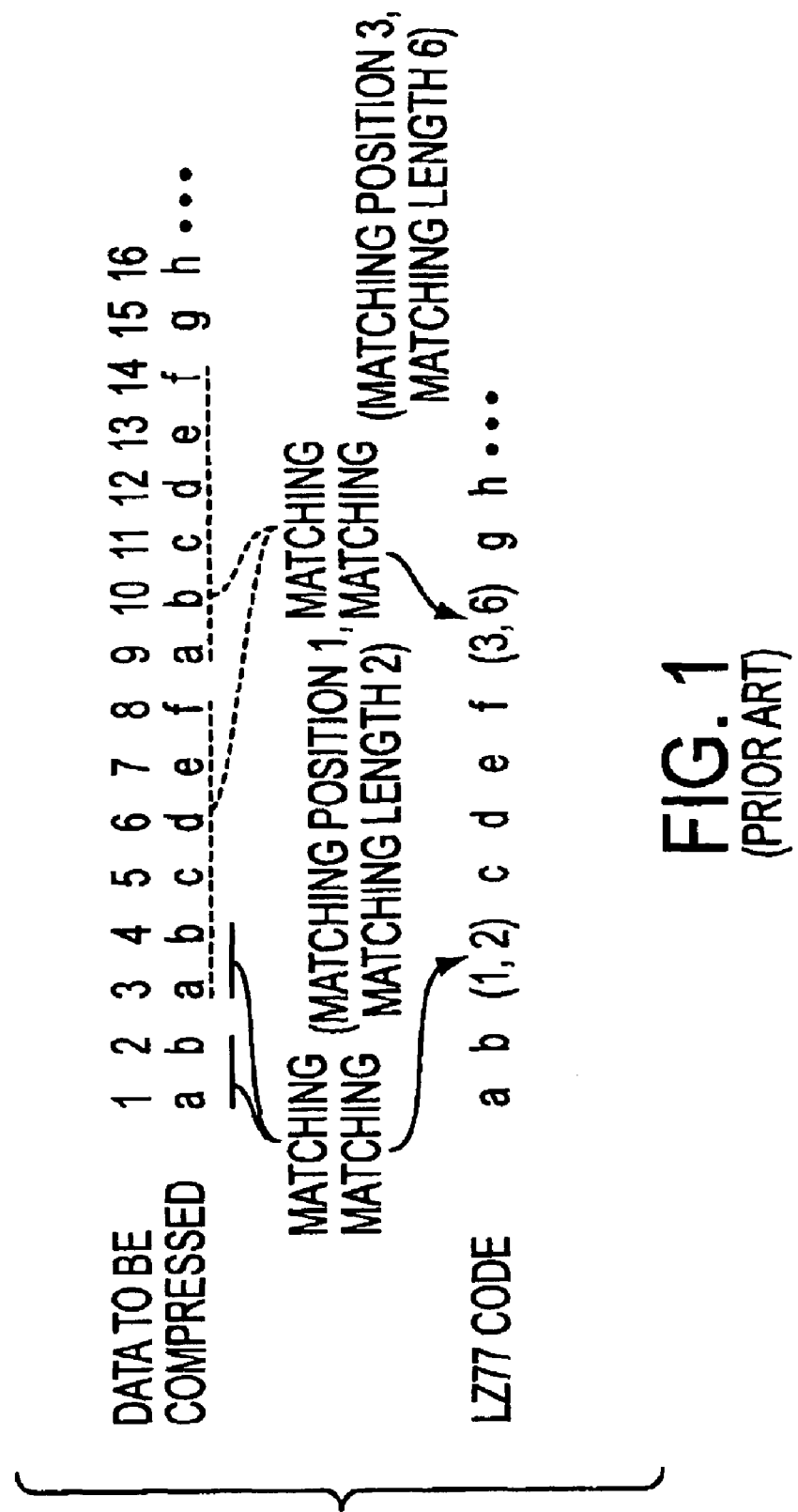
FIG. 1 shows the encoding method using the conventional LZ77 code.
Figure 2:
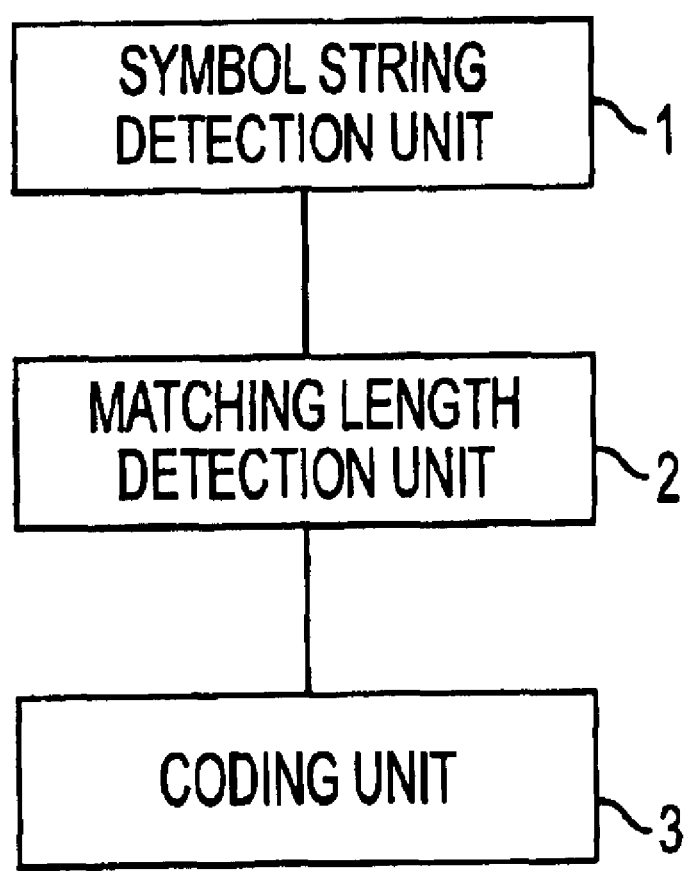
FIG. 2 is a block diagram of the configuration of the coding apparatus according to the first embodiment of the present invention.

FIG. 2 is a block diagram of the configuration of the coding apparatus according to the first embodiment of the present invention.

In FIG. 2, a symbol string detection unit 1 detects a second symbol string matching a first symbol string having a predetermined length of n from input symbol strings. A matching length detection unit 2 detects a matching length k between a third symbol string following the first symbol string and a fourth symbol string following the second symbol string. A coding unit 3 codes an input symbol string based on the symbol string detected by the symbol string detection unit 1 and the matching length k detected by the matching length detection unit 2.

As a result, when the third symbol string is coded based on the matching length k, the occurrence position of the fourth symbol string corresponding to the third symbol string can be detected based on the first symbol string, and it is not necessary to insert an excess code indicating the occurrence position of the fourth symbol string. Therefore, a high compression rate can be maintained for a repetition of long symbol strings while the reduction of the compression rate for a repetition of short symbol strings can be avoided.

Figure 3:
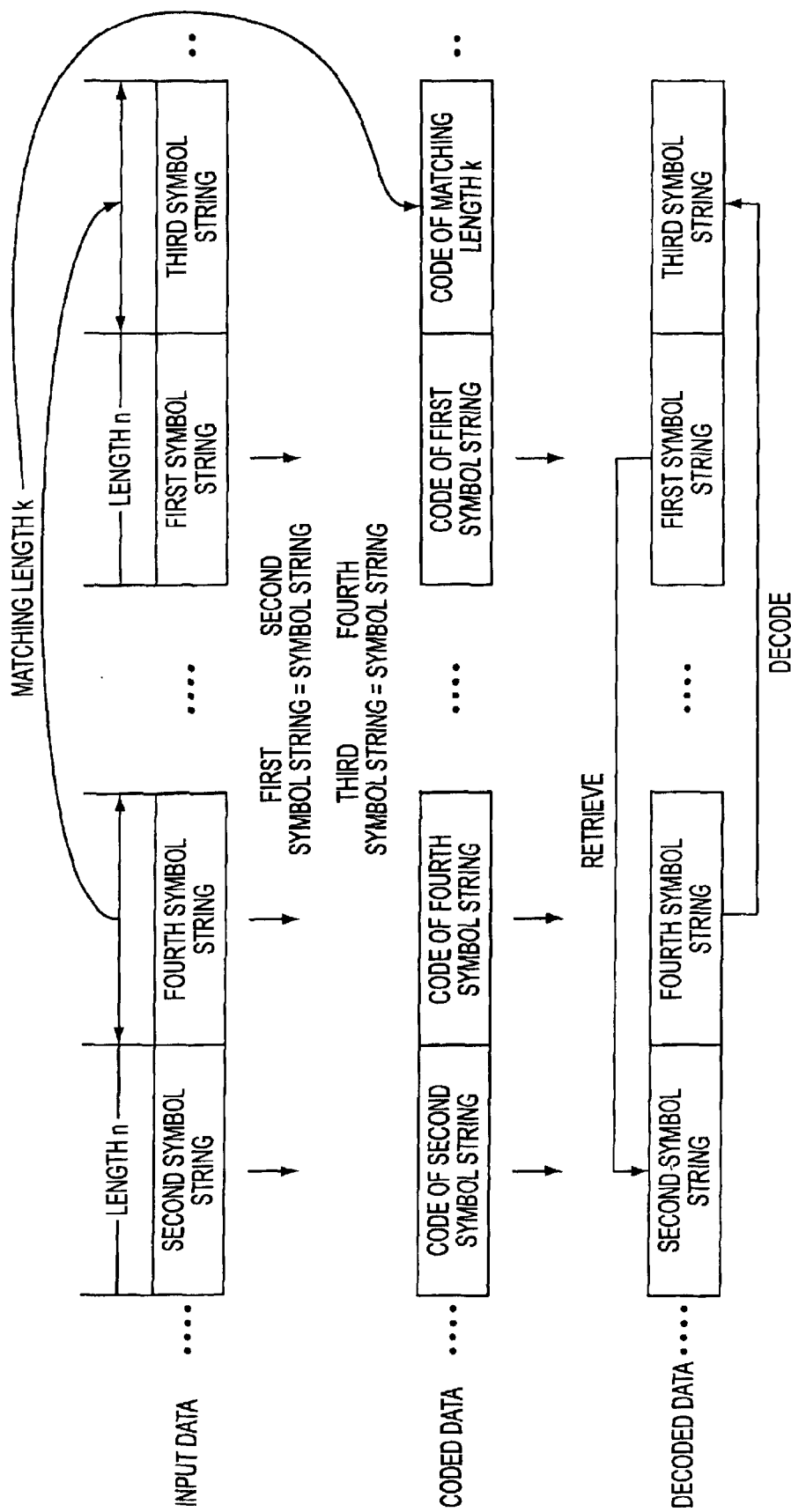
FIG. 3 shows the coding method and the decoding method according to the first embodiment of the present invention.

FIG. 3 shows the coding method and the decoding method according to the first embodiment of the present invention.

In FIG. 3, a second symbol string having the length of n is input as input data. Assuming that, after the second symbol string is input, a first symbol string having the length of n is input. Assuming that the first symbol string matches the second symbol string, the first symbol string is sequentially compared with the symbol strings input previously to detect the second symbol string matching the first symbol string, thereby specifying the occurrence position of the second symbol string.

When the occurrence position of the second symbol string can be specified, the matching length k between the third symbol string following the first symbol string and the fourth symbol string following the second symbol string is checked, and the third symbol string is coded base on the matching length k.

As a result, a code corresponding to the first symbol string of the input data, a code corresponding to the third symbol string of the input data, a code of the second symbol string of the input data, and a code of the matching length k can be generated as coded data.

When the coded data are decoded, the code corresponding to the second symbol string, the code corresponding to the fourth symbol string, and the code corresponding to the first symbol string are decoded. Then, a symbol string matching the first symbol string is retrieved from the decoding result. If the second symbol string is detected as a symbol string matching the first symbol string, then the code of the matching length k following the code of the first symbol string is decoded to obtain the matching length k. If the matching length k is obtained, the fourth symbol string having the matching length k and following the second symbol string is output as a decoding result of the third symbol string.

Thus, when the first and second symbol strings match each other, the third symbol string is coded based on the matching length k. As a result, when long symbol strings repeatedly occur, the repetition of the long symbol strings can be coded based on the matching length k, thereby efficiently compressing data. In addition, since the first symbol string is coded based on the symbol string, the fourth symbol string required when the third symbol string coded based on the matching length k is decoded can be detected using the first symbol string. As a result, it is not necessary to insert an identification code for use in detecting the fourth symbol string into coded data. Accordingly, data can also be efficiently compressed when short symbol strings repeatedly occurs.

Figure 4:
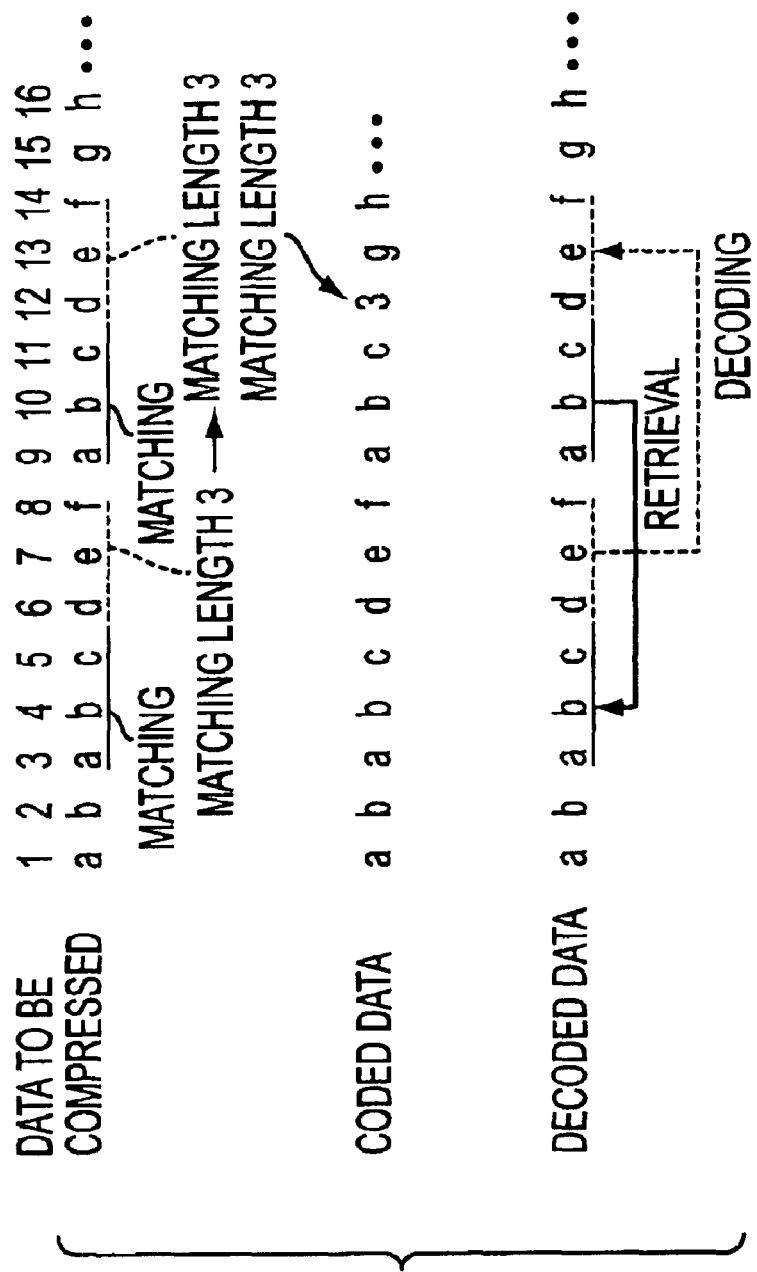
FIG. 4 shows the data compressing method according to the second embodiment of the present invention.

FIG. 4 shows the data compressing method according to the second embodiment of the present invention. According to the second embodiment, an n-character string is retrieved from the previously input data, and the currently input data is coded based on the matching length k of the matching portion from the (n+1)th character. According to the embodiment described below, a character is input. However, the present invention is not limited to the compression of character codes, but can be applied to various data. That is, based on an information logic, one work unit of data is referred to as a character (alphabet), and a string of any number of words is referred to as a character string.

In FIG. 4, assume that a character string 'a b a b c d e f a b c d e f g h . . . ' is input as data to be compressed, and an input number indicating an occurrence position is assigned to each character of the data to be compressed. In addition, assume that n=3, a 3-character string is retrieved from the previously input data, and the currently input data is coded based on the matching length k of the matching portion from the fourth character.

First if 'a' having the input number 1 is input, then the character 'a' is coded as is because it has no preceding characters. Then, when a character 'b' having the input number 2 is input, it is compared with the previously input characters. However, there are no characters matching the character 'b', the character 'b' is coded as is. Furthermore, when a character string 'a b' having the input numbers 3 and 4 is input, it is compared with the previously input character strings. As a result, the character string matches a character string 'a b' having the input numbers 1 and 2. However, since the length of the character string 'a b' is 2, and is smaller than n=3, the character string 'a b' having the input numbers 3 and 4 are coded as is.

Next, when a character 'c' having the input number 5 is input, it does not match any of the previously input characters. Therefore, the character 'c' is coded as is. When a character 'd' having the input number 6 is input, it does not match any of the previously input characters. Therefore, the character 'd' is coded as is. When a character 'e' having the input number 7 is input, it does not match any of the previously input characters. Therefore, the character 'e' is coded as is. When a character 'f' having the input number 8 is input, it does not match any of the previously input characters. Therefore, the character 'f' is coded as is.

When a character string 'a b c' having the input numbers 9 through 11 is input, it matches the character string 'a b c' having the input numbers 3 through 5, and n=3. Therefore, the character string 'a b c' having the input numbers 9 through 11 is coded as is, and the character string having the input numbers of and after 12 is coded based on the matching length k of the character string having the input numbers of and after 6. Since the character string 'd e f' having the input numbers 6 through 8 matches the character string 'd e f' having the input numbers 12 through 14, and the matching length k=3, the character string 'd e f' having the input numbers 12 through 14 is coded based on the matching length of 3.

Next, when a character 'g' having the input number 15 is input, it does not match any of the previously input characters. Therefore, the character 'g' is coded as is. When a character 'h' having the input number 16 is input, it does not match any of the previously input characters. Therefore, the character 'h' is coded as is.

As a result, coded data 'a b a b c d e f a b c 3 g h . . . ' is obtained for the data 'a b a b c d e f a b c d e f g h . . . ' to be compressed.

Thus, the character string 'a b c' having the input numbers 9 through 11 is not coded based on a matching length even if it matches the character string 'abc' having the input numbers 3 through 5. In this case, the character string 'a b c' having the input numbers 9 through 11 is coded, and the character string 'd e f' having the input numbers 12 through 14 following the character string 'a b c' having the input numbers 9 through 11 is coded based on a matching length.

Next, when the coded data 'a b a b c d e f a b c 3 g h . . . ' is decoded, the character string 'a b a b c d e f' is first decoded. Then, after the character string 'a b a b c d e f' is decoded, the character string 'a b c' immediately before the code indicating the matching length of 3 is decoded. When the code indicating the matching length of 3 following the character string 'a b c' is decoded, the previous character string matching the character string 'a b c' is retrieved from the previously decoded character string 'a b a b c d e f'. When the previous character string 'a b c' is detected from the character string 'a b a b c d e f', the next code indicates a matching length. Thus, the 3-character string 'd e f' following the previous character string 'a b c' can be obtained, and the character string 'd e f' is output as a decoding result of a code indicating the matching length of 3 following the character string 'a b c'.

As described above, unlike the LZ77 system, only a matching length is used as a code according to the fourth embodiment of the present invention. Therefore, a code indicating a matching position is not required, thereby realizing efficient data compression even when short character strings repeatedly occur.

FIG. 5 is a block diagram of the configuration of the data compression apparatus according to the second embodiment of the present invention.

Figure 5A:
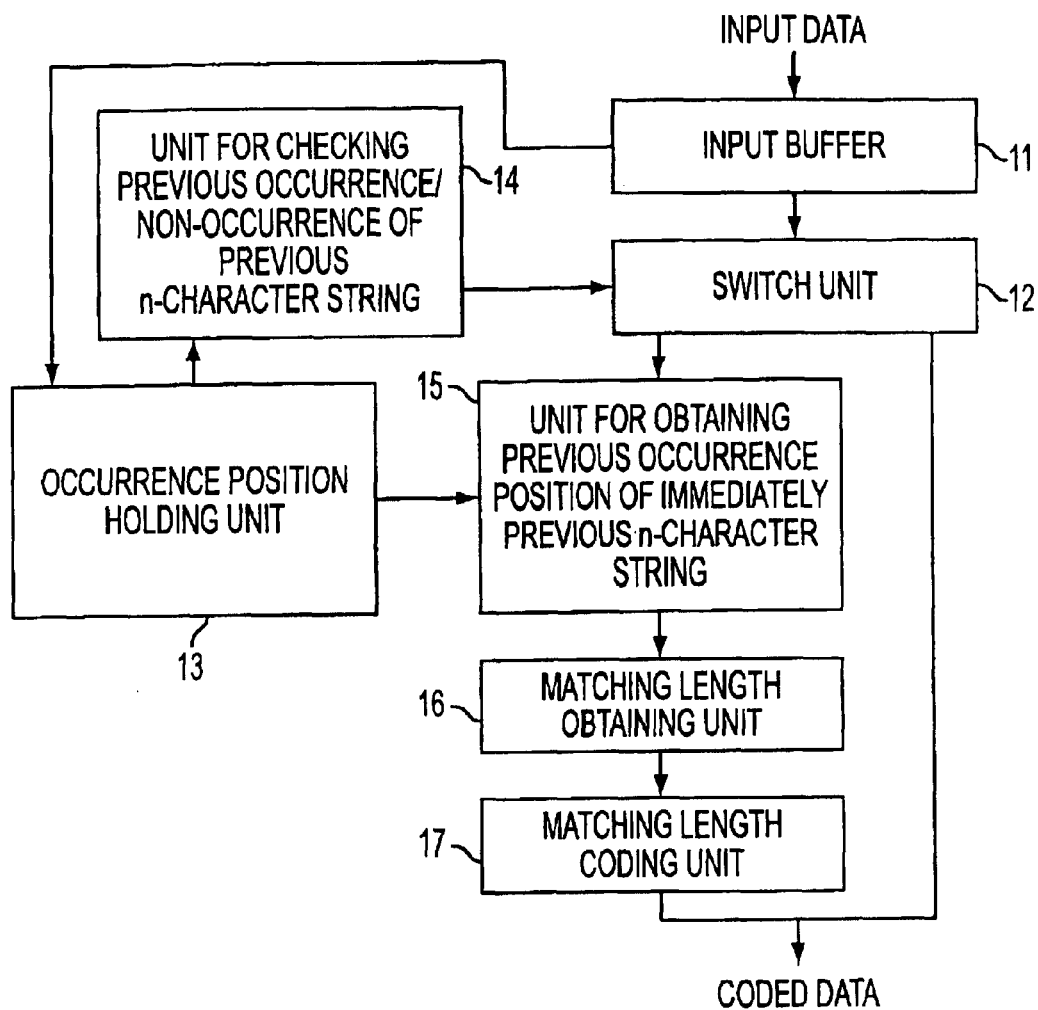
FIGS. 5A and 5B are block diagram of the configuration of the data compression apparatus according to the second embodiment of the present invention.
Figure 5B:
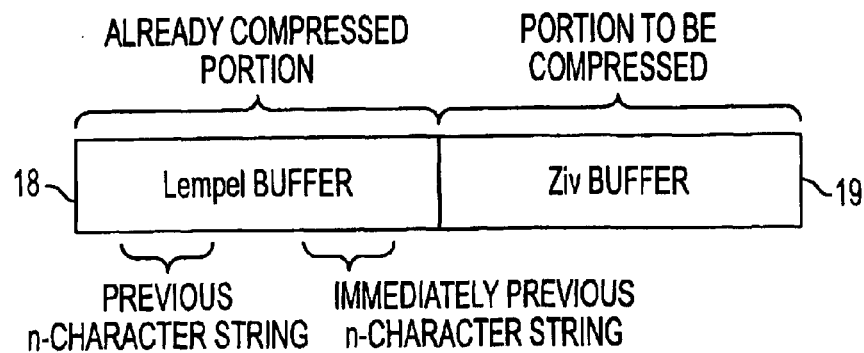

In FIG. 5A, an input buffer 11 is provided with a Lempel buffer 18 for storing an already compressed portion of the data to be compressed shown in FIG. 5B; and a Ziv buffer 19 for storing a portion to be compressed of the data to be compressed. An occurrence position holding unit 13 stores a part or all of the occurrence position of the character string having the length of n (hereinafter referred to as an n-character string) in the Lempel buffer 18.

An occurrence/non-occurrence check unit 14 checks whether or not the occurrence position of the previous n-character string which is the same as the n-character string immediately before the Ziv buffer 19 is stored in the occurrence position holding unit 13, and notifies a switch unit 12 of the check result. When the switch unit 12 receives a notification that the occurrence position of the previous n-character string which is the same as the n-character string immediately before the Ziv buffer 19 is stored, the switch unit 12 instructs an occurrence position obtaining unit 15 to obtain the occurrence position of the previous n-character string which is the same as the n-character string immediately before the Ziv buffer 19.

When the occurrence position obtaining unit 15 obtains the occurrence position of the previous n-character string which is the same as the n-character string immediately before the Ziv buffer 19, a matching length obtaining unit 16 obtains the matching length k between the character string after the occurrence position of the previous n-character string in the Lempel buffer 18 and the character string at and after the start of the Ziv buffer 19. When the matching length k is obtained, a matching length coding unit 17 codes based on the matching length k the portion, in the character string at and after the start of the Ziv buffer 19, matching the character string at and after the occurrence position of the previous n-character string in the Lempel buffer 18.

On the other hand, when the switch unit 12 receives a notification that the occurrence position of the previous n-character string which is the same as the n-character string immediately before the Ziv buffer 19 is not stored, the character string at and after the start of the Ziv buffer 19 is coded as is, and output to the output buffer.

The occurrence position holding unit 13 can be designed to hold only the latest occurrence position in the same n-character string in the Lempel buffer 18.

FIG. 6 is a block diagram of the configuration of the data reconstruction apparatus according to the second embodiment of the present invention.

Figure 6A:
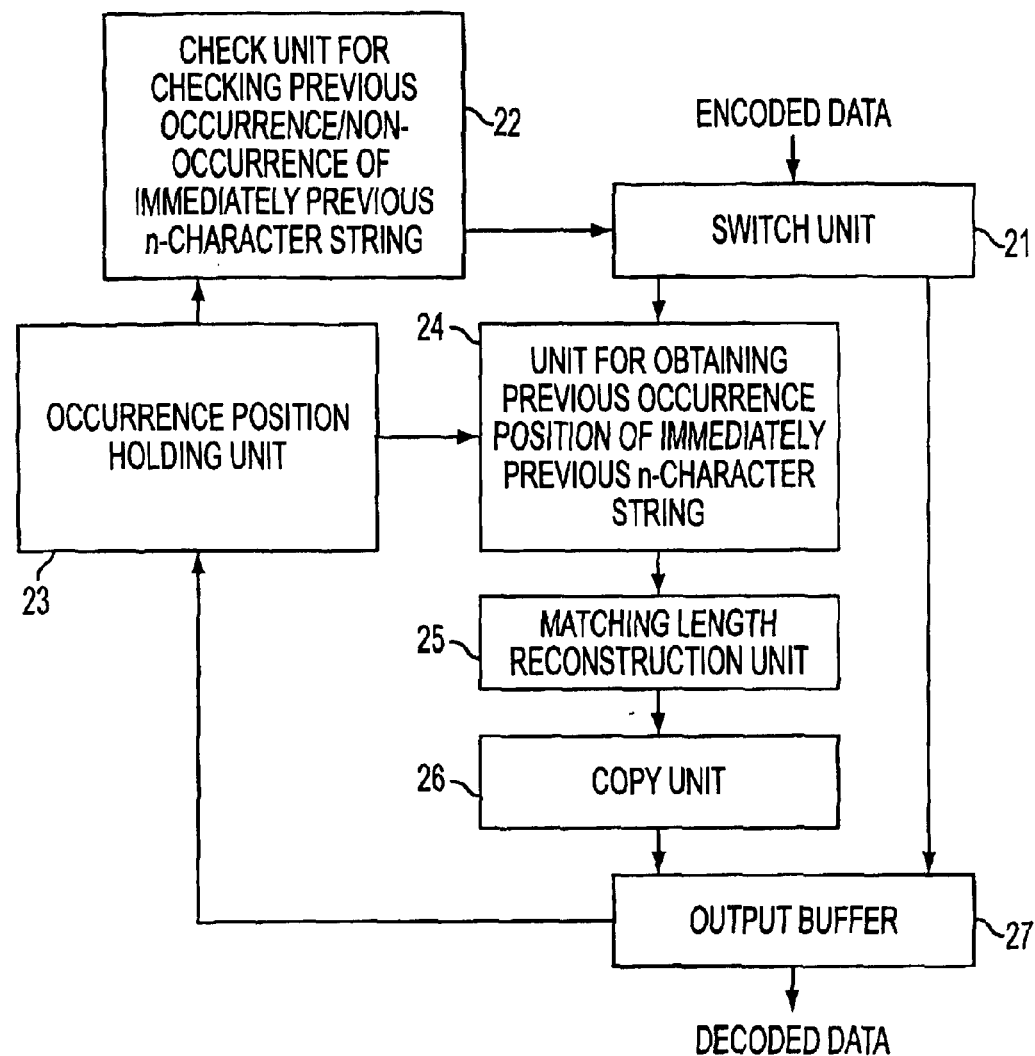
FIGS. 6A and 6B are block diagram of the configuration of the data reconstruction apparatus according to the second embodiment of the present invention.
Figure 6B:
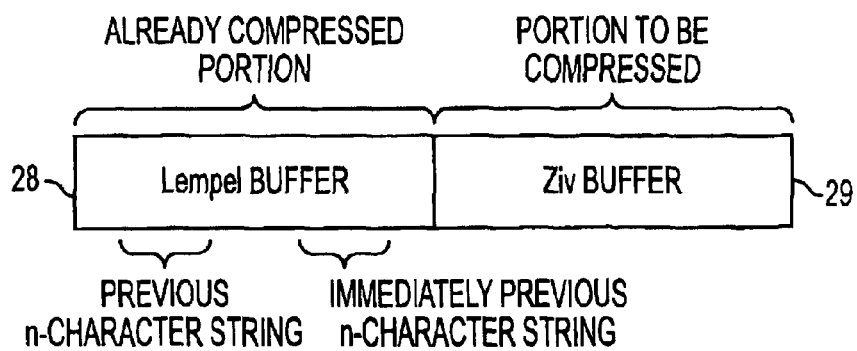

In FIG. 6A, an output buffer 27 is provided with a Lempel buffer 28 for storing an already reconstructed portion of the compressed data shown in FIG. 6B; and a Ziv buffer 29 for storing a portion to be reconstructed in the compressed data. An occurrence position holding unit 23 stores a part or all of the occurrence position of the n-character string in the Lempel buffer 28.

An occurrence/non-occurrence check unit 22 checks whether or not the occurrence position of the previous n-character string which is the same as the n-character string immediately before the Ziv buffer 29 is stored in the occurrence position holding unit 23, and notifies a switch unit 21 of the check result. When the switch unit 21 receives a notification that the occurrence position of the previous n-character string which is the same as the n-character string immediately before the Ziv buffer 29 is stored, the switch unit 21 instructs an occurrence position obtaining unit 24 to obtain the occurrence position of the previous n-character string which is the same as the n-character string immediately before the Ziv buffer 29.

When an occurrence position obtaining unit 24 obtains the occurrence position of the previous n-character string which is the same as the n-character string immediately before the Ziv buffer 29, a matching length reconstruction unit 25 reconstructs the matching length k from the code after the n-character string immediately before the Ziv buffer 29. When the matching length k is reconstructed, a copy unit 26 copies a character string having the matching length k following the previous n-character string in the Lempel buffer 28, and outputs the copy result as a result of reconstructing the code after the n-character string immediately before the Ziv buffer 29.

On the other hand, when the switch unit 21 receives a notification that the occurrence position of the previous n-character string which is the same as the n-character string immediately before the Ziv buffer 29 is not stored, the input coded data is output as is to the output buffer.

Figure 7:
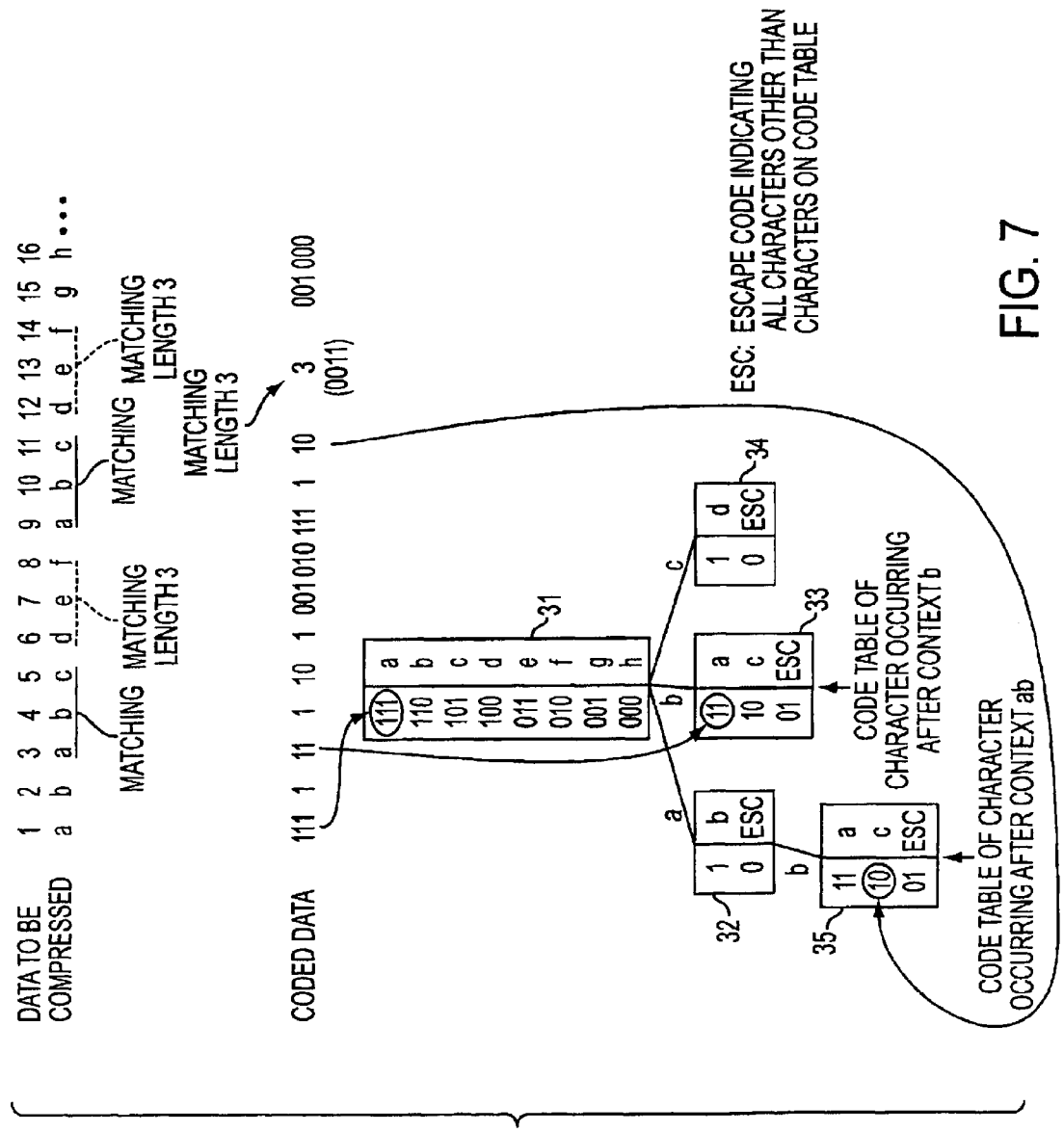
FIG. 7 shows the data compressing method according to the third embodiment of the present invention.

FIG. 7 shows the data compressing method according to the third embodiment of the present invention. According to the third embodiment, data to be compressed is coded by the method shown in FIG. 4, and the portion not replaced with a matching length is coded by the probability statistic type coding system using context.

In FIG. 7, assume that a character string 'a b a b c d e f a b c d e f g h . . . ' is input as data to be compressed, and an input number indicating an occurrence position is assigned to each character of the data to be compressed. In addition, assume that n=3, a 3-character string is retrieved from the previously input data, and the currently input data is coded based on the matching length k of the matching portion from the fourth character.

Furthermore, assume that there are a code table 31 of characters; a code table 32 of characters occurring after a context a; a code table 33 of characters occurring after a context b; a code table 34 of characters occurring after a context c; and a code table 35 of characters occurring after a context 'a b'.

Also assume that, in the code table 31, a code 111 is assigned to a character 'a', a code '110' is assigned to a character 'b', a code '101' is assigned to a character 'c', a code '100' is assigned to a character 'd', a code '011' is assigned to a character 'e', a code '010' is assigned to a character 'f', a code '001' is assigned to a character 'g', and a code '000' is assigned to a character 'h', In addition, assume that, in the code table 32, a code '1' is assigned when the character 'b' occurs after the context 'a', and a code '0' is assigned when a character other than the character 'b' occurs after the context 'a'; in the code table 33, a code '11' is assigned when the character 'a' occurs after the context 'b', a code '10' is assigned when the character 'c' occurs after the context 'b', and a code '01' is assigned when a character other than the characters 'a' and 'c' occurs after the context 'b'; in the code table 34, a code '1' is assigned when the character 'd' occurs after the context 'c', a code '0' is assigned when a character other than the character 'd' occurs after the context 'c'; and in the code table 35, a code '11' is assigned when the character 'a' occurs after the context 'a b', a code '10' is assigned when the character 'c' occurs after the context 'a b', and a code '01' is assigned when a character other than the characters 'a' and 'c' occurs is after the context 'a b'.

First, when the character 'a' having the input number 1 is input, '111' is output as a code corresponding to the character 'a' by referring to the code table 31. Next, when the character 'b' having the input number 2 is input, the code table 32 is referred to using as a context the character 'a' immediately before the character 'b' having the input number 2, and '1' is output as a code corresponding to the character 'b' having the input number 2. Then, when the character 'a' having the input number 3 is input, the code table 33 is referred to using as a context the character 'b' immediately before the character 'a' having the input number 3, and '11' is output as a code corresponding to the character 'a' having the input number 3. Next, when the character 'b' having the input number 4 is input, the code table 32 is referred to using as a context the character 'a' immediately before the character 'b' having the input number 4, and '1' is output as a code corresponding to the character 'b' having the input number 4. Then, when the character 'c' having the input number 5 is input, the code table 35 is referred to using as a context the character string 'a b' immediately before the character 'c' having the input number 5, and '10' is output as a code corresponding to the character 'c' having the input number 5. Next, when the character 'd' having the input number 6 is input, the code table 34 is referred to using as a context the character 'c' immediately before the character 'd' having the input number 6, and '1' is output as a code corresponding to the character 'd' having the input number 6.

Next, when the character 'e' having the input number 7 is input, '011' is output as a code corresponding to the character 'e' by referring to the code table 31. Then, when the character 'f' having the input number 8 is input, '010' is output as a code corresponding to the character 'f' by referring to the code table 31. Next, when the character 'a' having the input number 9 is input, '111' is output as a code corresponding to the character 'a' by referring to the code table 31. When the character 'b' having the input number 10 is input, the code table 32 is referred to using as a context the character 'a' immediately before the character 'b' having the input number 10, and '1' is output as a code corresponding to the character 'b' having the input number 10. Next, when the character 'c' having the input number 11 is input, the code table 35 is referred to using as a context the character string 'a b' immediately before the character 'c' having the input number 11, and '10' is output as a code corresponding to the character 'c' having the input number 11.

Since the character string 'a b c' having the input numbers 9 through 11 matches the character string 'abc' having the input numbers 3 through 5, and n=3, the character strings having the input numbers equal to and larger than 12 are coded based on the matching length with the character strings having the input numbers equal to and larger than 6. Since the character string 'd e f' having the input numbers 6 through 8 matches the character string 'd e f' having the input numbers 12 through 14, and the matching length is 3, the character string 'd e f' having the input numbers 12 through 14 is coded based on the matching length of 3, and '0011' is output as a code corresponding to the matching length of 3.

Next, when the character 'g' having the input number 15 is input, '001' is output as a code corresponding to the character 'g' by referring to the code table 31. Then, when the character 'h' having the input number 16 is input, '000' is output as a code corresponding to the character 'h' by referring to the code table 31.

According to the above described embodiment, a matching length code is expressed by 4 bits, but can be expressed by any number of bits. In addition, a code table can be prepared for a matching length, and a matching length can be coded based on the code table.

Figure 8:
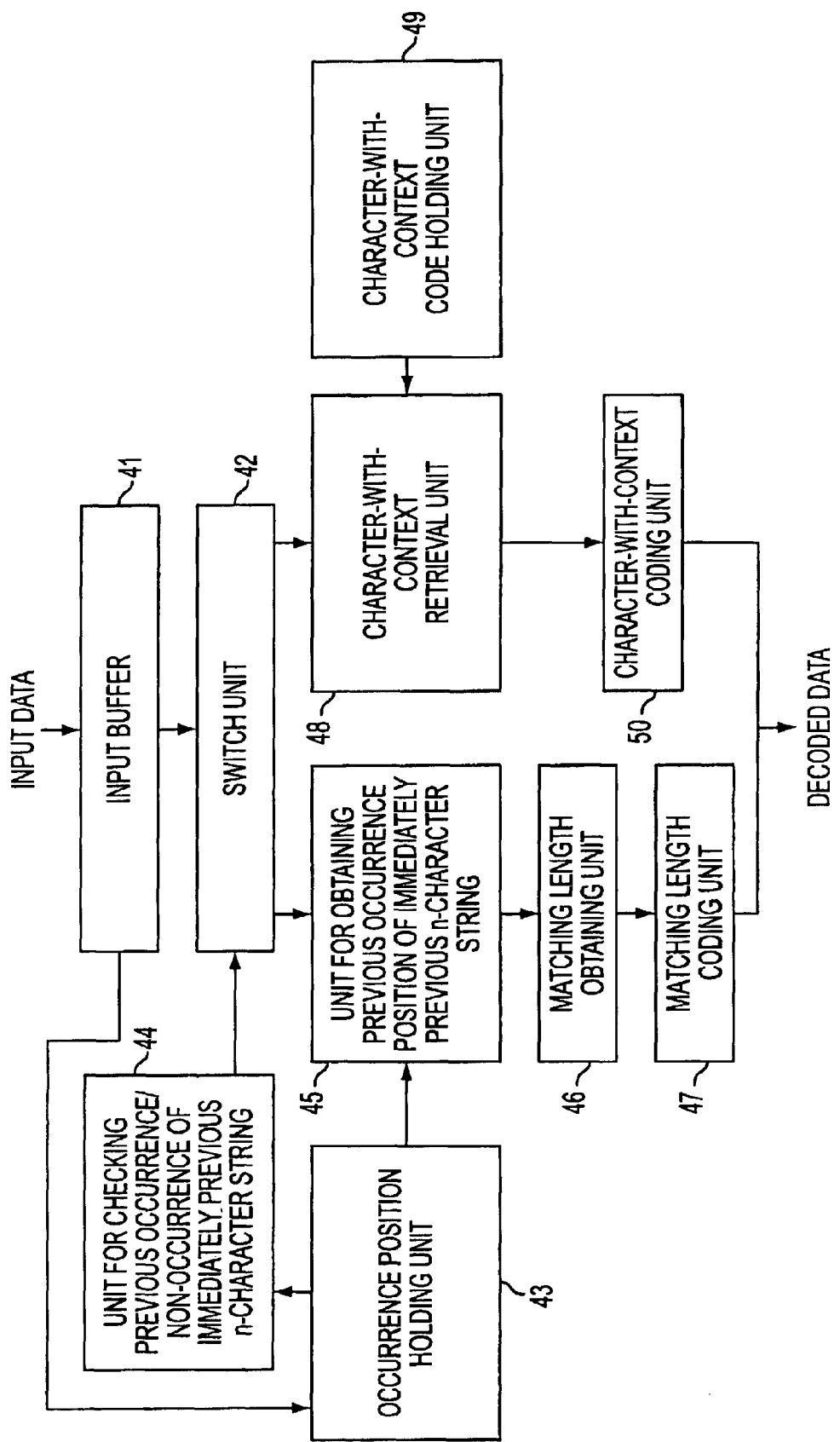
FIG. 8 is a block diagram of the configuration of the data compression apparatus according to the third embodiment of the present invention.

FIG. 8 is a block diagram of the configuration of the data compression apparatus according to the third embodiment of the present invention In FIG. 8, an input buffer 41 comprises a Lempel buffer for storing an already compressed portion of the data to be compressed; and a Ziv buffer for storing a portion to be compressed of the data to be compressed. An occurrence position holding unit 43 stores a part or all of the occurrence position of the n-character string in the Lempel buffer.

An occurrence/non-occurrence check unit 44 checks whether or not the occurrence position of the same character string as the n-character string immediately before the Ziv buffer is stored in the occurrence position holding unit 43, and notifies a switch unit 42 of the check result. When the switch unit 42 receives a notification that the occurrence position of the same character string as the n-character string immediately before the Ziv buffer is stored, it instructs an occurrence position obtaining unit 45 to obtain the occurrence position of the same character string as the n-character string immediately before the Ziv buffer.

When the occurrence position obtaining unit 45 obtains the occurrence position of the same character string as the n-character string immediately before the Ziv buffer, a matching length obtaining unit 46 obtains the matching length k between the character string at and after the occurrence position in the Lempel buffer and the character string at and after the start of the Ziv buffer. When the matching length k is obtained, a matching length coding unit 47 codes a portion matching the character strings at and after the occurrence position in the character strings at and after the start of the Ziv buffer.

On the other hand, when the switch unit 42 receives a notification that the occurrence position of the same character string as the n-character string immediately before the Ziv buffer is not stored, it instructs a character-with-context retrieval unit 48 to receive the next character from the data to be compressed using the immediately previous character string 0 through (m−1) as a context, and retrieve it from a character-with-context code holding unit 49. The character-with-context code holding unit 49 holds a code corresponding to each type of next occurring character using the immediately previous 0 through (m−1) (m≧1) character string as a context, When the character-with-context retrieval unit 48 retrieves a character with a context, a character-with-context coding unit 50 obtains a code corresponding to the character with a context from the character-with-context code holding unit 49.

If an n-character string obtained by combining a context having the length of (n−1) with the following character is linked to the occurrence position of the n-character string in the occurrence position holding unit 43, and the length of the context checked by the character-with-context retrieval unit 48 is (n−1), then the notification that the occurrence position of the same character string as the n-character string immediately before the Ziv buffer is stored can be provided for the occurrence/non-occurrence check unit 44.

Figure 9:
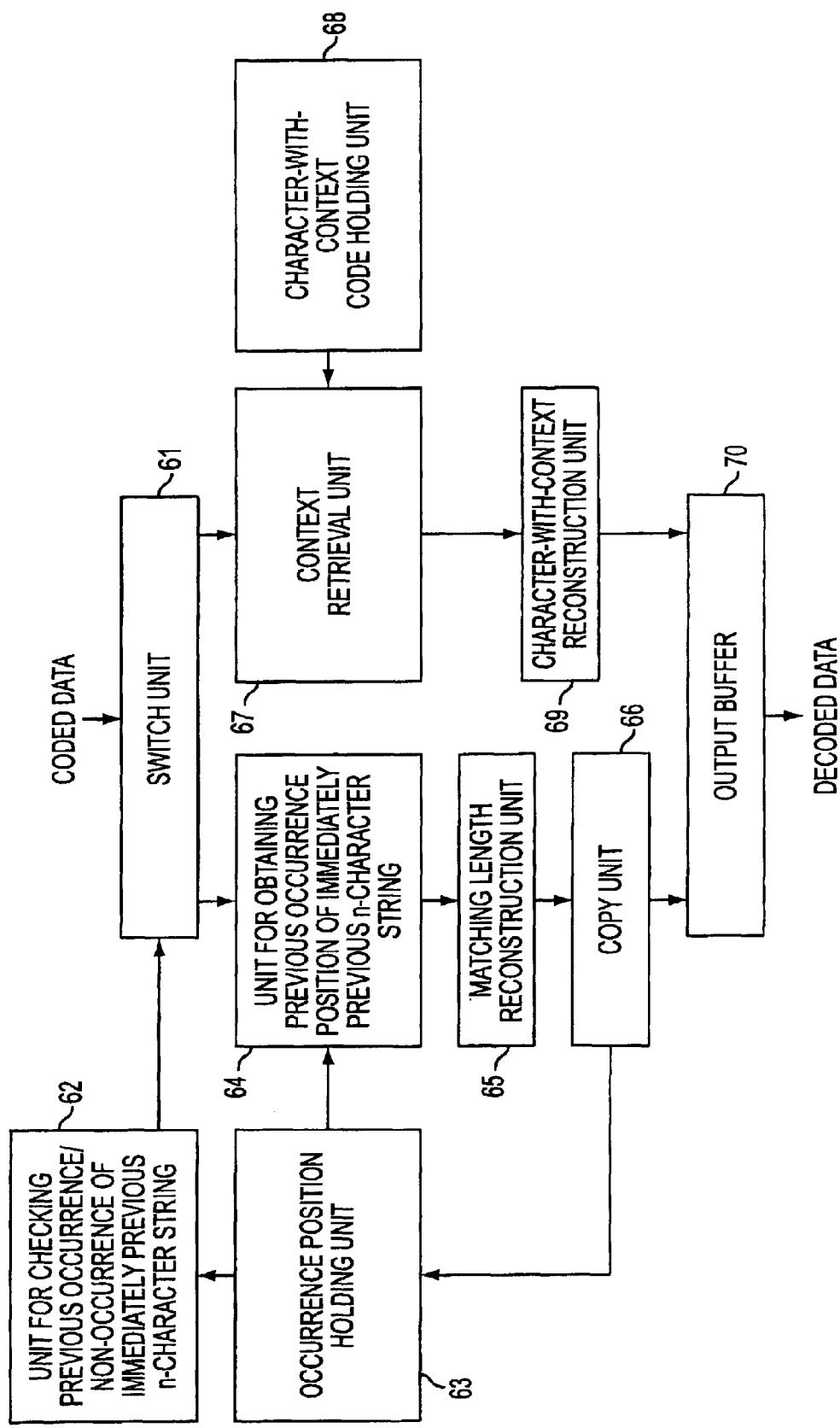
FIG. 9 is a block diagram of the configuration of the data reconstruction apparatus according to the third embodiment of the present invention.

FIG. 9 is a block diagram of the configuration of the data reconstruction apparatus according to the third embodiment of the present invention.

In FIG. 9, an output buffer 70 comprises a Lempel buffer for storing an already reconstructed portion of compressed data and a Ziv buffer for storing a portion to be reconstructed of the compressed data. An occurrence position holding unit 63 holds a part or all of the occurrence position of an n-character string in the Lempel buffer.

An occurrence/non-occurrence check unit 62 checks whether or not the occurrence position of the same character string as the n-character string immediately before the Ziv buffer is held by the occurrence position holding unit 63, and notifies a switch unit 61 of the check result. When the switch unit 61 receives a notification that the occurrence position of the same character string as the n-character string immediately before the Ziv buffer is stored, it instructs an occurrence position obtaining unit 64 to obtain the occurrence position of the same character string as the n-character string immediately before the Ziv buffer.

When the occurrence position obtaining unit 64 obtains the occurrence position of the same character string as the n-character string immediately before the Ziv buffer, a matching length reconstruction unit 65 reconstructs the matching length k from an input code. When the matching length k is reconstructed, a copy unit 66 copies a character string of the matching length k following the n-character string in the Lempel buffer, and outputs the copy result to the output buffer as the reconstruction result of the code after the n-character string immediately before the Ziv buffer.

On the other hand, when the switch unit 61 receives a notification that the occurrence position of the same character string as the n-character string immediately before the Ziv buffer is not stored, it instructs a context retrieval unit 67 to retrieve a code with the immediately previous 0 through (m−1) character string as a context from a character-with-context code holding unit 68. The character-with-context code holding unit 68 holds a code of the next character using the immediately previous 0 through (m−1) character string as a context. A character-with-context reconstruction unit 69 reconstructs a character from the code retrieved by the context retrieval unit 67.

Figure 10:
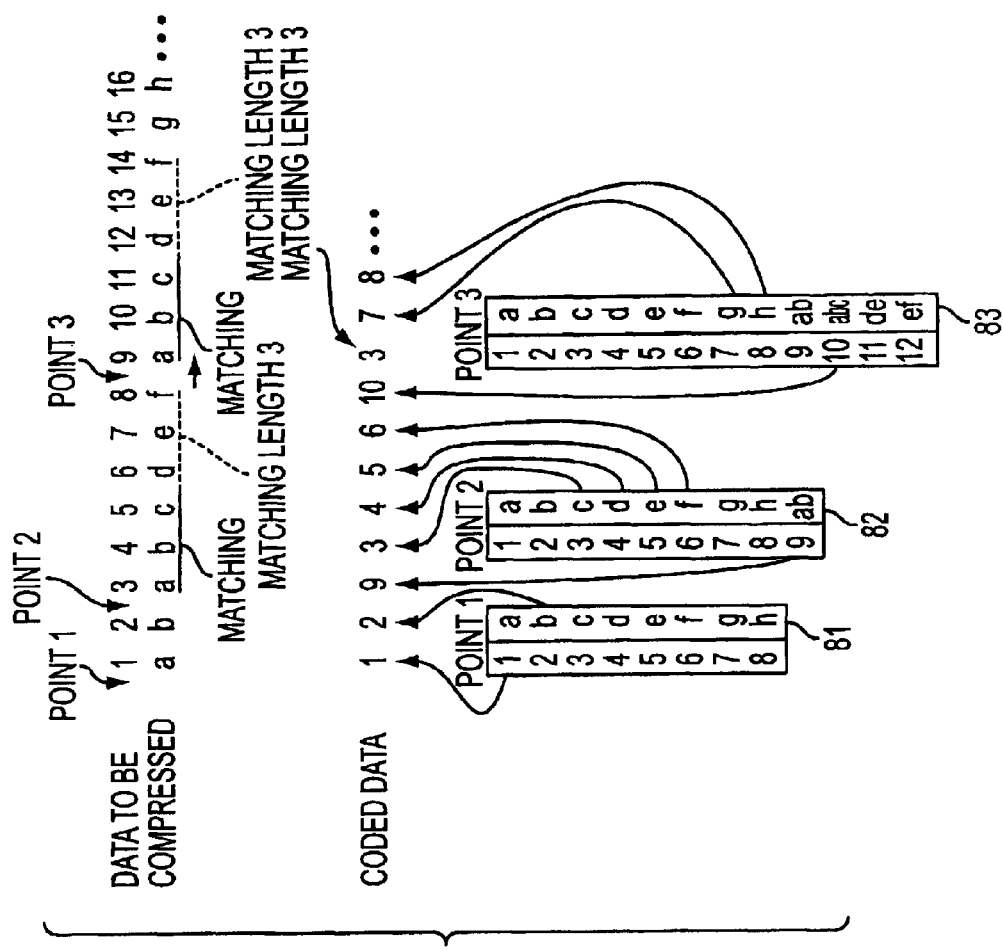
FIG. 10 shows the data compressing method according to the fourth embodiment of the present invention.

FIG. 10 shows the data compressing method according to the fourth embodiment of the present invention. In the fourth embodiment, data to be compressed is coded in the method shown in FIG. 3, and a portion not replaced with a matching length is coded by the LZ78 system.

In FIG. 10, assume that a character string 'a b a b c d e f a b c d e f g h . . . ' is input as data to be compressed, and an input number indicating an occurrence position is assigned to each character of the data to be compressed. In addition, assume that n=3, a 3-character string is retrieved from the previously input data, and the currently input data is coded based on the matching length k of the matching portion from the fourth character.

In addition, assume that a dictionary 81 in which characters 'a' through 'h' are entered is provided, and the characters 'a' through 'h' are respectively assigned the reference numbers 1 through 8.

First, when a character 'a' having the input number 1 is entered, a reference number 1 is output as a code corresponding to the character 'a' having the input number 1 by referring to the dictionary 81. Next, when a character 'b' having the input number 2 is entered, a reference number 2 is output as a code corresponding to the character 'b' having the input number 2 by referring to the dictionary 81. A character string 'a b' having the input numbers 1 and 2 is entered in the dictionary 81, and the dictionary 81 is updated into a dictionary 82. Then, 9 is entered as a reference number of the character string 'a b'.

Next, when a character string 'a b' having the input numbers 3 and 4 is entered, the dictionary 82 is referred to, and the reference number 9 is output as a code corresponding to the character string 'a b' having the input numbers 3 and 4.

Next, when a character 'c' having the input number 5 is entered, a reference number 3 is output as a code corresponding to the character 'c' having the input number 5 by referring to the dictionary 82. A character string 'a b c' having the input numbers 3 through 5 is entered in the dictionary 83, and 10 is entered as a reference number of the character string 'a b c'.

Next, when a character 'd' having the input number 6 is entered, a reference number 4 is output as a code corresponding to the character 'd' having the input number 6 by referring to the dictionary 82. Then, when a character 'e' having the input number 7 is entered, a reference number 5 is output as a code corresponding to the character 'e' having the input number 7 by referring to the dictionary 82. A character string 'd e' is entered in the dictionary 83, and 11 is entered as a reference number. When a character 'f' having the input number 8 is entered, the dictionary 82 is referred to, and the reference number 6 is output as a code corresponding to the character 'f' having the input number 8. Then, a character string 'e f' is entered in the dictionary 83, and 12 is entered as a reference number.

Next, when a character string 'a b c' having the input numbers 9 through 11 is input, the character string 'a b c' having the input numbers 9 through 11 is coded using the reference number 10 entered in the dictionary 83. The character string 'a b c' having the input numbers 9 through 11 matches the previous character string 'a b c' having the input numbers 3 through 5, and n=3, the character strings having the input numbers equal to and larger than 12 are coded based on the matching length with the character strings having the input numbers equal to and larger than 6. As a result, the character string 'd e f' having the input numbers 6 through 8 matches the character string 'd e f' having the input numbers 12 through 14, and the matching length k is equal to 3. Therefore, the character string 'd e f' having the input numbers 12 through 14 is coded based on the matching length of 3.

When a character 'g' having the input number 15 is input, it does not match any of the previously input characters. Therefore, the dictionary 83 is referred to, and the reference number 7 is output as a code corresponding to the character 'g' having the input number 15. Next, when a character 'h' having the input number 16 is input, it does not match any of the previously input characters. Therefore, the dictionary 83 is referred to, and the reference number 8 is output as a code corresponding to the character 'h' having the input number 16.

Thus, an initial dictionary has all characters that possibly occur and are assigned respective codes, and the characters are sequentially coded and entered in the dictionary to output a code which is assigned to characters/character strings entered in the dictionary and match each other based on the longest matching length (LZ78 code). In addition, when the same character string as the previous n-character string occurs (point 3), the matching length at. and after the (n+1) character string is coded and output, and then back to the LZ78 code. By processing the matching starting portion as the character string as is, and coding it by the LZ 78 system or the probability statistic type coding system, a code indicating whether or not the subsequent code is a matching length code is not required. As a result, a high compression rate can be attained using a matching length code for a repetition of long character strings while a high compression rate by the LZ78 system and the probability statistic type coding system can be utilized as is for a repetition of short character strings.

Figure 11:
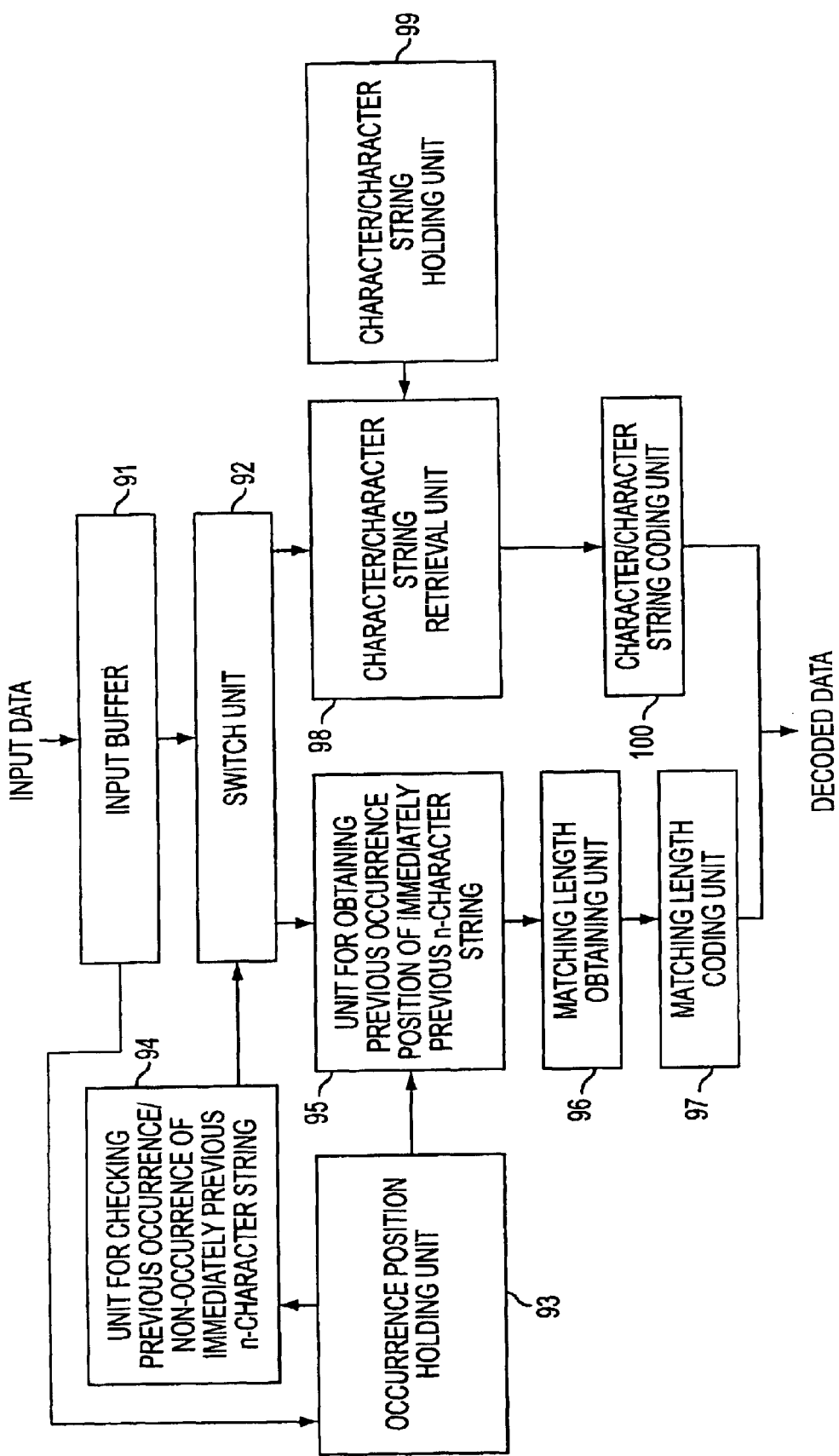
FIG. 11 is a block diagram of the configuration of the data compression apparatus according to the fourth embodiment of the present invention.

FIG. 11 is a block diagram of the configuration of the data compression apparatus according to the fourth embodiment of the present invention In FIG. 11, an input buffer 91 comprises a Lempel buffer for storing an already compressed portion of the data to be compressed; and a Ziv buffer for storing a portion to be compressed of the data to be compressed. An occurrence position holding unit 93 stores a part or all of the occurrence position of the n-character string in the Lempel buffer.

An occurrence/non-occurrence check unit 94 checks whether or not the occurrence position of the same character string as the n-character string immediately before the Ziv buffer is stored in the occurrence position holding unit 93, and notifies a switch unit 92 of the check result. When the switch unit 92 receives a notification that the occurrence position of the same character string as the n-character string immediately before the Ziv buffer is stored, it instructs an occurrence position obtaining unit 95 to obtain the occurrence position of the same character string as the n-character string immediately before the Ziv buffer.

When the occurrence position obtaining unit 95 obtains the occurrence position of the same character string as the n-character string immediately before the Ziv buffer, a matching length obtaining unit 96 obtains the matching length k between the character string at and after the occurrence position in the Lempel buffer and the character string at and after the start of the Ziv buffer. When the matching length k is obtained, a matching length coding unit 97 codes a portion matching the character strings at and after the occurrence position in the character strings at and after the start of the Ziv buffer.

When a character/character string holding unit 99 holds a code corresponding to a character or a character string having the length of 1 through m, and the switch unit 92 receives a notification that the occurrence position of the same character as the n-character string immediately before the Ziv buffer is not held, it instructs a character/character string retrieval unit 98 to retrieve a character or a character string matching the data to be compressed based on the longest matching length from the character or the character string hold in the character/character string holding unit 99. A character/character string coding unit 100 then codes the character or the character string retrieved by the character/character string retrieval unit 98 using the code held by the character/character string holding unit 99.

If the character string having the length of n held in the character/character string holding unit 99 is linked to the occurrence position of the n-character string in the occurrence position holding unit 93, and the length of the character or the character string coded by the character/character string coding unit 100 is n, then the occurrence/non-occurrence check unit 94 can be informed that the occurrence position of the same character string as the n-character string immediately before the Ziv buffer is held.

Figure 12:
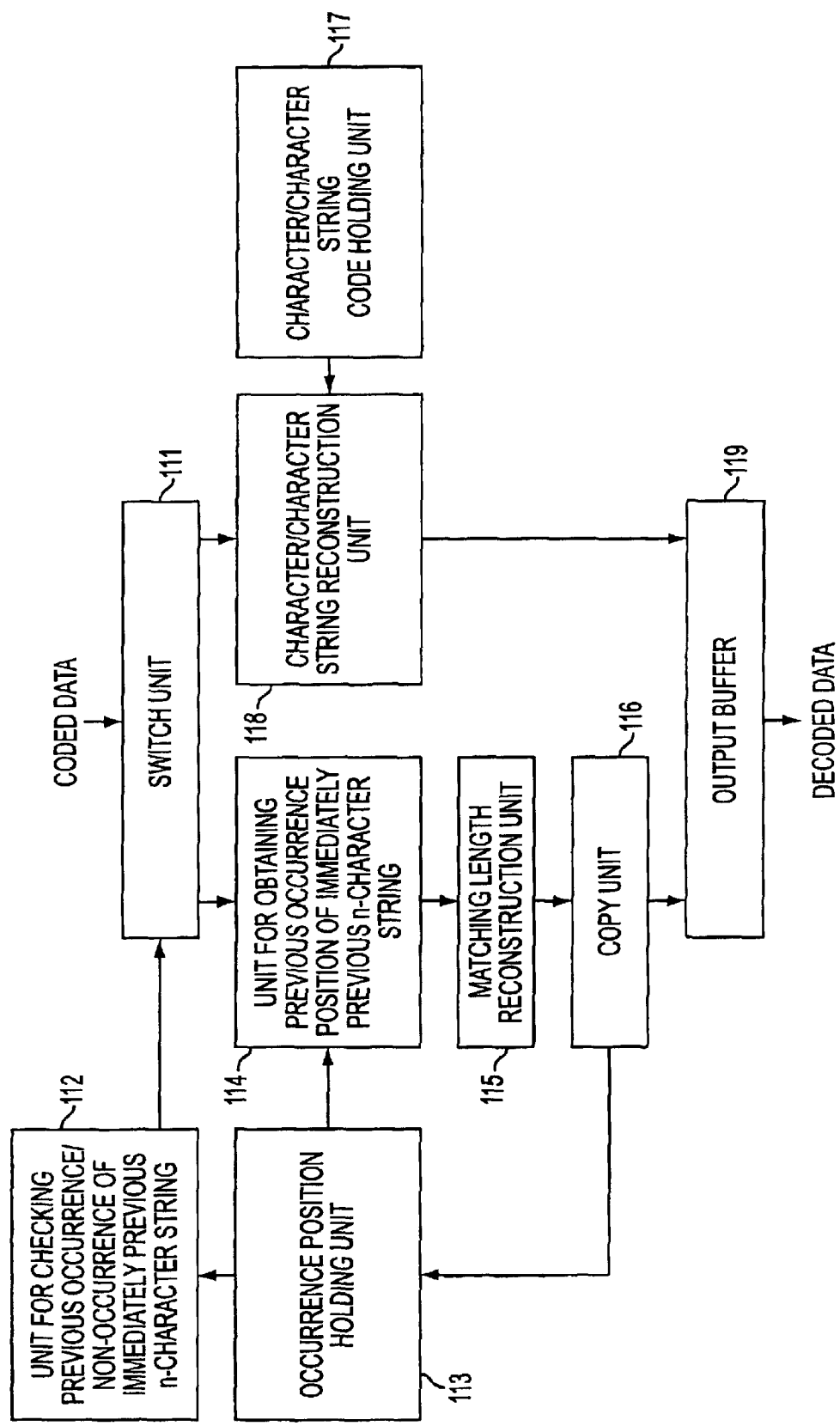
FIG. 12 is a block diagram of the configuration of the data reconstruction apparatus according to the fourth embodiment of the present invention.

FIG. 12 is a block diagram of the configuration of the data reconstruction apparatus according to the fourth embodiment of the present invention.

In FIG. 12, an output buffer 119 comprises a Lempel buffer for storing an already reconstructed portion of compressed data and a Ziv buffer for storing a portion to be reconstructed of the compressed data. An occurrence position holding unit 113 holds a part or all of the occurrence position of an n-character string in the Lempel buffer.

An occurrence/non-occurrence check unit 112 checks whether or not the occurrence position of the same character string as the n-character string immediately before the Ziv buffer is held by the occurrence position holding unit 113, and notifies a switch unit 111 of the check result. When the switch unit 111 receives a notification that the occurrence position of the same character string as the n-character string immediately before the Ziv buffer is stored, it instructs an occurrence position obtaining unit 114 to obtain the occurrence position of the same character string as the n-character string immediately before the Ziv buffer.

When the occurrence position obtaining unit 114 obtains the occurrence position of the same character string as the n-character string immediately before the Ziv buffer, a matching length reconstruction unit 115 reconstructs the matching length k from an input code. When the matching length k is reconstructed, a copy unit 116 copies a character string of the matching length k following the n-character string in the Lempel buffer, and outputs the copy result to the output buffer 119 as the reconstruction result of the code after the n-character string immediately before the Ziv buffer.

When a character/character string holding unit 117 holds a code corresponding to a character or a character string having the length of 1 through m, and the switch unit 111 receives a notification that the occurrence position of the same character as the n-character string immediately before the Ziv buffer is not held, it instructs a character/character string reconstruction unit 118 to reconstruct a character or a character string based on the code held by the character/character string code holding unit 117.

Thus, if the occurrence position holding unit 113 does not hold the immediately previous n-character string, it is not output as is, but is coded by the probability statistic type coding system or the LZ78 system. As a result, a high compression rate of the LZ78 system or the probability statistic type coding system can be obtained for a repetition of short character strings in a data string to be compressed, and a high compression rate can be obtained based on a matching length code for a repetition of long character strings.

Figure 13A:
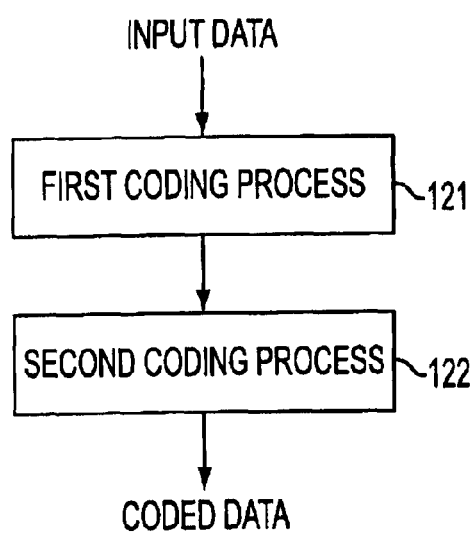
FIGS. 13A and 13B shows the coding method and decoding method according the fifth embodiment of the present invention.

FIG. 13A shows the coding method according to the fifth embodiment of the present invention.

In FIG. 13A, a first coding process 121 is performed on input data, and then a second coding process 122 is performed on the input data, thereby performing a 2-step coding process on the input data.

In this example, the first coding process 121 codes a part of a matching symbol string based on a matching length, and the second coding process 122 furthermore codes by the probability statistic type coding system the symbol string coded in the first coding process 121. In addition, as a probability statistic type code, a Shannon Fanno code, a Huffman code, an arithmetic code, a Jones code, an adaptive Huffman code, an adaptive arithmetic code, a code using a context model, etc. can be used.

Furthermore, the first coding process 121 codes a part of a matching symbol string based on a matching length, and the second coding process 122 furthermore codes by the dictionary type coding system the symbol string coded in the first coding process 121. In addition, as a dictionary type code, an LZ78 code, an LZW code, an LZC code, an LZY code, an LZT code, an LZFG code, etc. can be used.

Figure 13B:
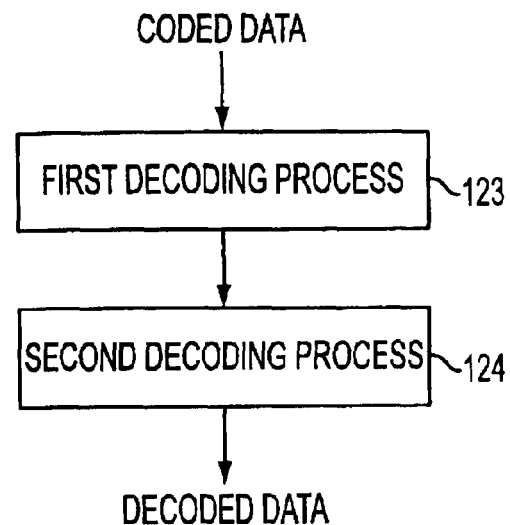

FIG. 13B shows the decoding method according to the fifth embodiment of the present invention.

In FIG. 13B, a first decoding process 123 is performed on coded data, and then a second decoding process 124 is performed on the coded data, thereby performing a 2-step decoding process on coded data.

Figure 14:
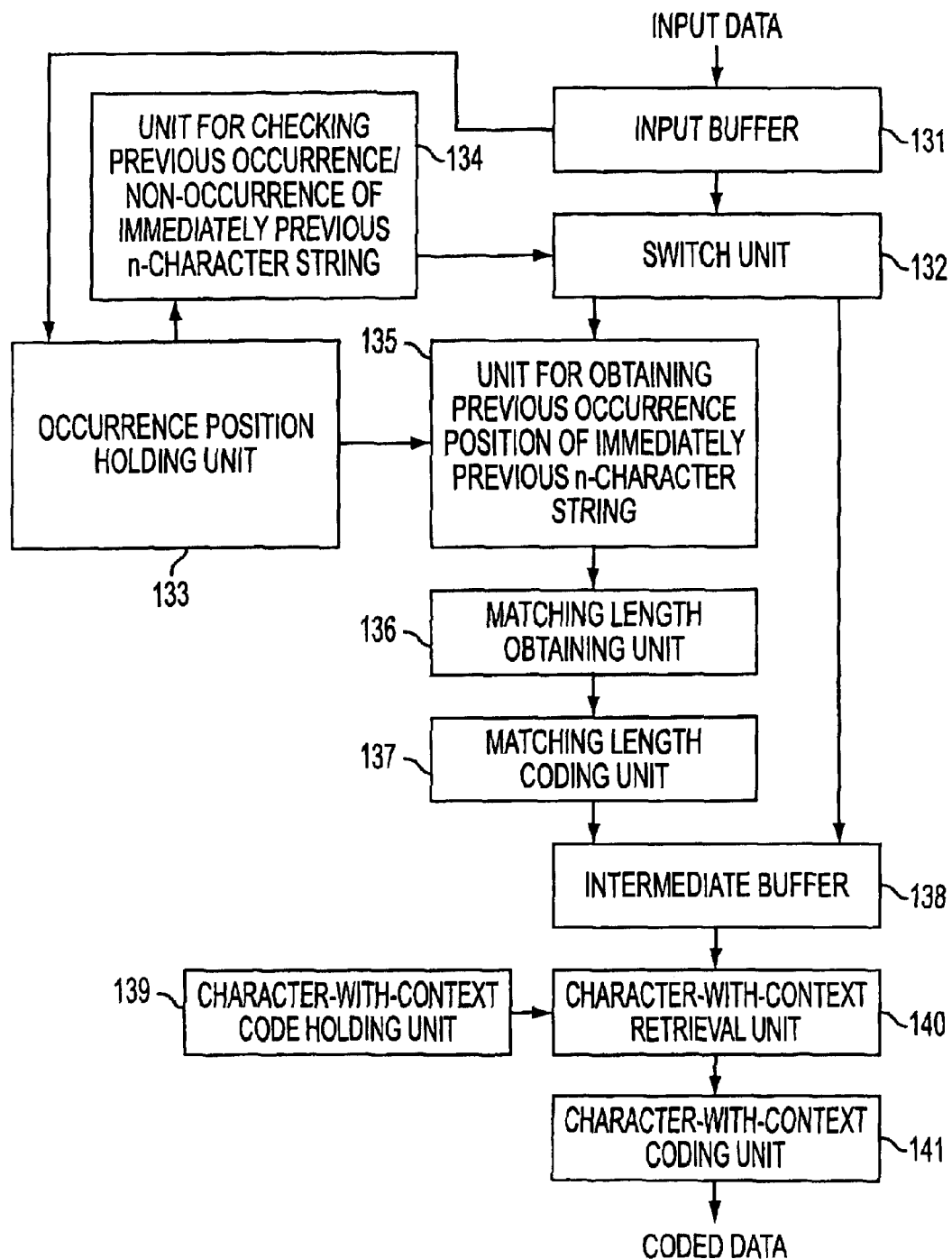
FIG. 14 is a block diagram of the configuration of the data compression apparatus according to the sixth embodiment of the present invention.

FIG. 14 is a block diagram of the configuration of the data compression apparatus according to the sixth embodiment of the present invention. In this sixth embodiment, data to be compressed is coded by the method shown in FIG. 4, and the data coded by the method shown in FIG. 4 is furthermore coded by the probability statistic type coding system using a context.

In FIG. 14, an input buffer 131 comprises a Lempel buffer for storing an already compressed portion of the data to be compressed; and a Ziv buffer for storing a portion to be compressed of the data to be compressed. An occurrence position holding unit 133 stores a part or all of the occurrence position of the n-character string in the Lempel buffer.

An occurrence/non-occurrence check unit 134 checks whether or not the occurrence position of the same character string as the n-character string immediately before the Ziv buffer is stored in the occurrence position holding unit 133, and notifies a switch unit 132 of the check result. When the switch unit 132 receives a notification that the occurrence position of the same character string as the n-character string immediately before the Ziv buffer is stored, it instructs an occurrence position obtaining unit 135 to obtain the occurrence position of the same character string as the n-character string immediately before the Ziv buffer.

When the occurrence position obtaining unit 135 obtains the occurrence position of the same character string as the n-character string immediately before the Ziv buffer, a matching length obtaining unit 136 obtains the matching length k between the character string at and after the occurrence position in the Lempel buffer and the character string at and after the start of the Ziv buffer. When the matching length k is obtained, a matching length coding unit 137 codes a portion matching the character strings at and after the occurrence position in the character strings at and after the start of the Ziv buffer, and outputs the result to an intermediate buffer 138.

When the switch unit 132 receives a notification that the occurrence position of the same character as the n-character string immediately before the Ziv buffer is not held, it outputs the character string at and after the start of the Ziv buffer as is to the intermediate buffer 138.

The intermediate buffer 138 holds a code indicating the matching length transmitted from the matching length coding unit 137, and holds the data to be compressed and transmitted from the switch unit 132.

A character-with-context code holding unit 139 stores a code of a character occurring next using the immediately previous character string 0 through (m−1) as a context. A character-with-context retrieval unit 140 retrieves the subsequent character from the character-with-context code holding unit 139 using the immediately previous character string 0 through (m−1). When the character-with-context retrieval unit 140 retrieves a character with a context, a character-with-context coding unit 141 codes the character with a context based on the code held in the character-with-context code holding unit 139.

Figure 15:
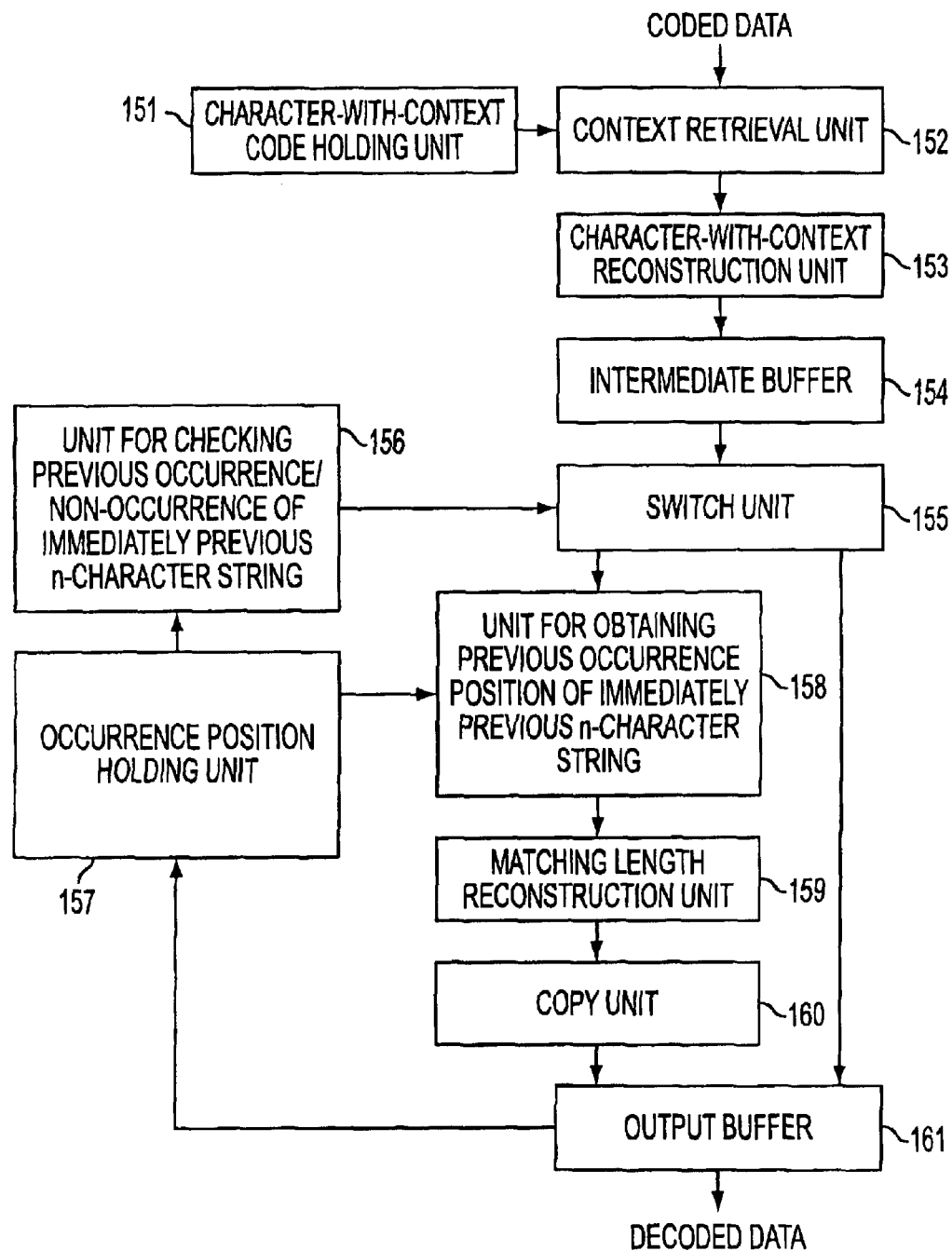
FIG. 15 is a block diagram of the configuration of the data reconstruction apparatus according to the sixth embodiment of the present invention.

FIG. 15 is a block diagram of the configuration of the data reconstruction apparatus according to the sixth embodiment of the present invention.

In FIG. 15, a character-with-context code holding unit 151 stores a code of a character occurring next using the immediately previous character string 0 through (m−1) as a context. A context retrieval unit 152 retrieves a code having the immediately previous character string 0 through (m−1) as a context from the character-with-context code holding unit 151 using the immediately previous character string 0 through (m−1). A character-with-context reconstruction unit 153 reconstructs a character from the code retrieved by the character-with-context code holding unit 151.

An intermediate buffer 154 holds the data reconstructed by the character-with-context reconstruction unit 153. An output buffer 161 comprises a Lempel buffer storing an already reconstructed portion of input data held in the intermediate buffer 154; and a Ziv buffer storing a portion to be reconstructed of input data held in the intermediate buffer 154. An occurrence position holding unit 157 holds a part or all of the occurrence position of the n-character string in the Lempel buffer.

An occurrence/non-occurrence check unit 156 checks whether or not the occurrence position of the same character string as the n-character string immediately before the Ziv buffer is stored in the occurrence position holding unit 157, and notifies a switch unit 155 of the check result. When the switch unit 155 receives a notification that the occurrence position of the same character string as the n-character string immediately before the Ziv buffer is stored, it instructs an occurrence position obtaining unit 158 to obtain the occurrence position of the same character string as the n-character string immediately before the Ziv buffer.

When the occurrence position obtaining unit 158 obtains the occurrence position of the same character string as the n-character string immediately before the Ziv buffer, a matching length reconstruction unit 159 reconstructs the matching length k from the code held in the intermediate buffer 154. When the matching length k is reconstructed, a copy unit 160 copies a character string of the matching length k following the n-character string in the Lempel buffer, and outputs the copy result to the output buffer 161 as a result of reconstructing the code after the n-character string immediately before the Ziv buffer.

On the other hand, when the switch unit 155 receives a notification that the occurrence position of the same character string as the n-character string immediately before the Ziv buffer is not held, it outputs the character string in the intermediate buffer 154 as is.

Figure 16:
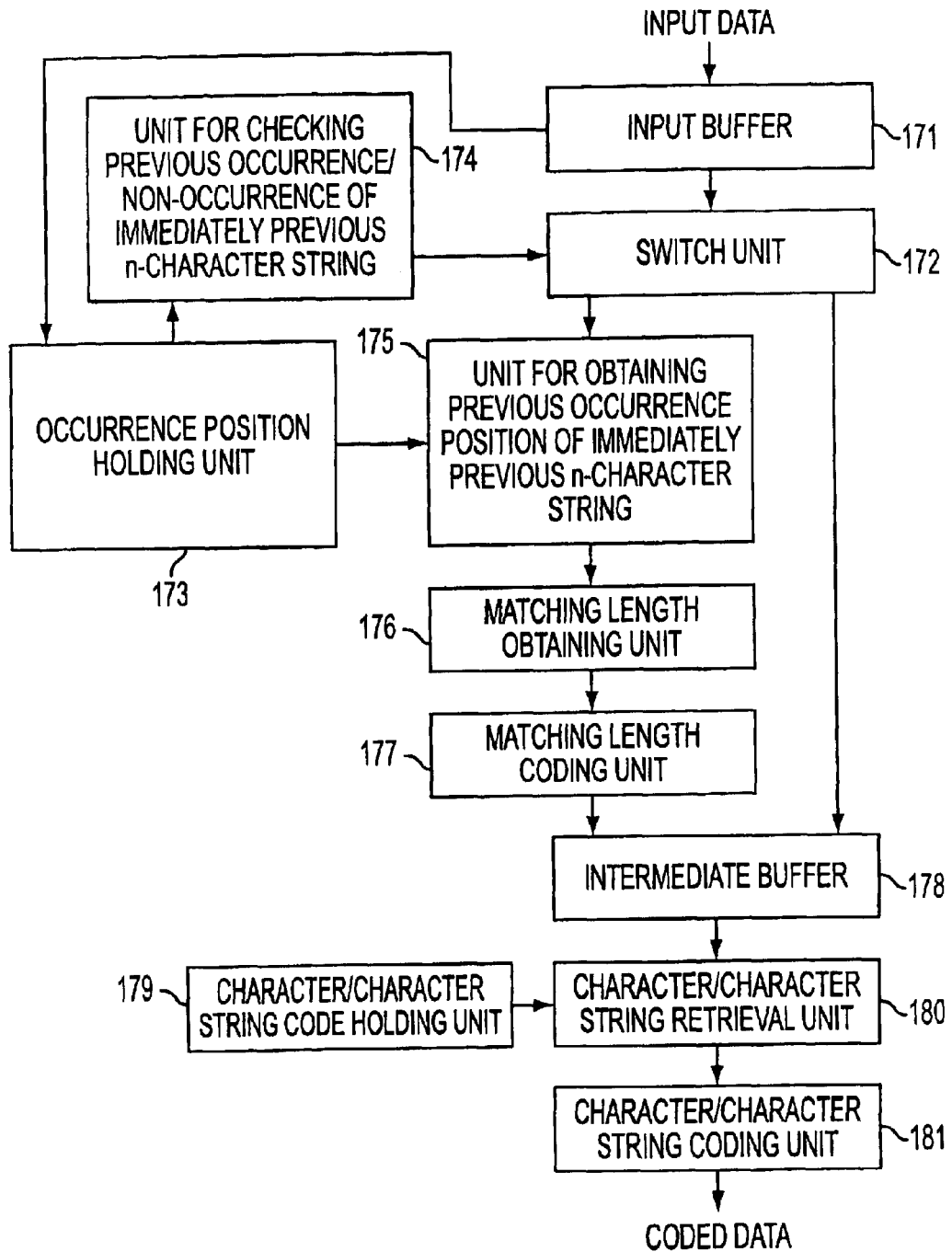
FIG. 16 is a block diagram of the configuration of the data compression apparatus according to the seventh embodiment of the present invention.

FIG. 16 is a block diagram of the configuration of the data compression apparatus according to the seventh embodiment of the present invention. According to the seventh embodiment, data to be compressed is coded in the method shown in FIG. 4, and the data coded in the method shown in FIG. 4 is furthermore coded by the LZ78 system.

In FIG. 16, an input buffer 171 comprises a Lempel buffer for storing an already compressed portion of the data to be compressed; and a Ziv buffer for storing a portion to be compressed of the data to be compressed. An occurrence position holding unit 173 stores a part or all of the occurrence position of the n-character string in the Lempel buffer.

An occurrence/non-occurrence check unit 174 checks whether or not the occurrence position of the same character string as the n-character string immediately before the Ziv buffer is stored in the occurrence position holding unit 173, and notifies a switch unit 172 of the check result. When the switch unit 172 receives a notification that the occurrence position of the same character string as the n-character string immediately before the Ziv buffer is stored, it instructs an occurrence position obtaining unit 175 to obtain the occurrence position of the same character string as the n-character string immediately before the Ziv buffer.

When the occurrence position obtaining unit 175 obtains the occurrence position of the same character string as the n-character string immediately before the Ziv buffer, a matching length obtaining unit 176 obtains the matching length k between the character string at and after the occurrence position in the Lempel buffer and the character string at and after the start of the Ziv buffer. When the matching length k is obtained, a matching length coding unit 177 codes the portion matching with the character strings at and after the occurrence position in the character strings at and after the start of the Ziv buffer, and outputs the result to an intermediate buffer 178.

When the switch unit 172 receives a notification that the occurrence position of the same character as the n-character string immediately before the Ziv buffer is not held, it outputs the character string at and after the start of the Ziv buffer as is to the intermediate buffer 178.

The intermediate buffer 178 holds a code indicating the matching length transmitted from the matching length coding unit 177, and holds the data to be compressed and transmitted from the switch unit 172.

A character/character string holding unit 179 holds a code corresponding to a character or a character string having the length of 1 through m, and a character/character string retrieval unit 180 retrieves a character or a character string matching in longest length with the data stored in the intermediate buffer 178 from the characters or character strings stored in the character/character string code holding unit 179.

A character/character string coding unit 181 codes the character or character string retrieved by the character/character string retrieval unit 180 according to the code held in the character/character string code holding unit 179.

Figure 17:
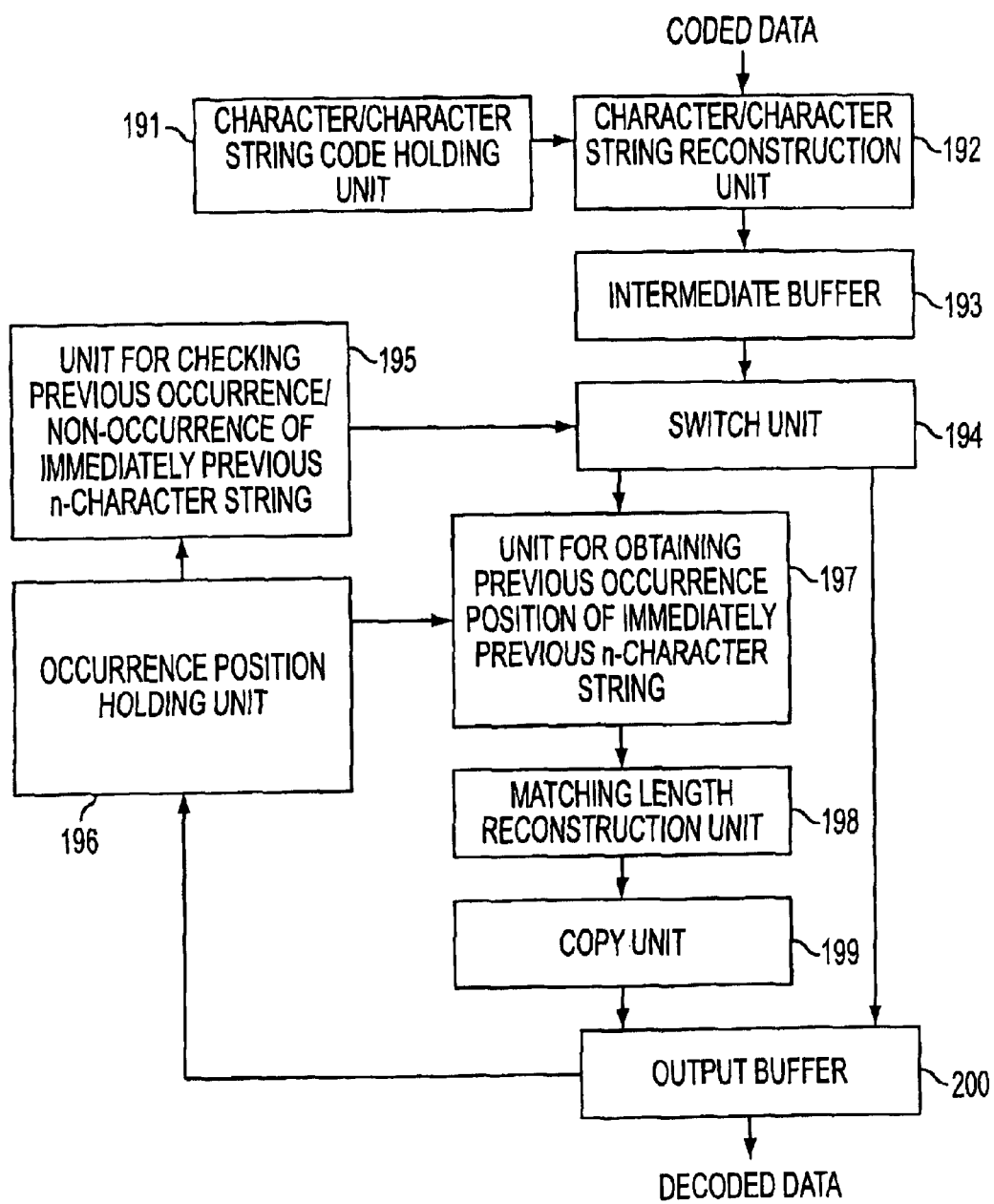
FIG. 17 is a block diagram of the configuration of the data reconstruction apparatus according to the seventh embodiment of the present invention.

FIG. 17 is a block diagram of the configuration of the data reconstruction apparatus according to the seventh embodiment of the present invention.

In FIG. 17, a character/character string code holding unit 191 holds a code corresponding to a character or a character string having the length of 1 through m, and a character/character string reconstruction unit 192 reconstructs a character or a character string according to a code held in the character/character string code holding unit 191. An intermediate buffer 193 holds the data reconstructed by the character/character string reconstruction unit 192.

An output buffer 200 comprises a Lempel buffer storing an already reconstructed portion of input data held in the intermediate buffer 193; and a Ziv buffer storing a portion to be reconstructed of input data held in the intermediate buffer 193. An occurrence position holding unit 196 holds a part or all of the occurrence position of the n-character string in the Lempel buffer.

An occurrence/non-occurrence check unit 195 checks whether or not the occurrence position of the same character string as the n-character string immediately before the Ziv buffer is stored in the occurrence position holding unit 196, and notifies a switch unit 194 of the check result. When the switch unit 194 receives a notification that the occurrence position of the same character string as the n-character string immediately before the Ziv buffer is stored, it instructs an occurrence position obtaining unit 197 to obtain the occurrence position of the same character string as the n-character string immediately before the Ziv buffer.

When the occurrence position obtaining unit 197 obtains the occurrence position of the same character string as the n-character string immediately before the Ziv buffer, a matching length reconstruction unit 198 reconstructs the matching length k from the code held in the intermediate buffer 193. When the matching length k is reconstructed, a copy unit 199 copies a character string of the matching length k following the n-character string in the Lempel buffer, and outputs the copy result to the output buffer 200 as a result of reconstructing the code after the n-character string immediately before the Ziv buffer.

On the other hand, when the switch unit 194 receives a notification that the occurrence position of the same character string as the n-character string immediately before the Ziv buffer is not held, it outputs the character string in the intermediate buffer 193 as is.

Thus, when an immediately previous n-character string is held by an occurrence position holding unit 196, the data coded based on a matching length is temporarily held in the intermediate buffer 193, and is further coded by the probability statistic type coding system or the LZ78 system, thereby effectively assigning a code to a long character string using the existing compression application as is.

A code used in the probability statistic type coding system or the LZ78 system can be obtained in a static coding process in which a predetermined code is used from start to end, or in a dynamic coding process in which codes are sequentially updated based on coded data.

As described above, according to the above described embodiment, a code indicating whether or not the following code is a matching length code is not required. Furthermore, based on the LZ78 system and the probability statistic type coding system, a matching length between the current and previous character strings can be output as a code as in the LZ77 system only when long character strings are repeated. Therefore, a high compression rate can be attained using a matching length code when long character strings are repeated while a high compression rate can also be attained by the LZ78 system or the probability statistic type coding system for a repetition of short character strings, thereby successfully obtaining a high compression rate for both short and long character strings.

Figure 18:
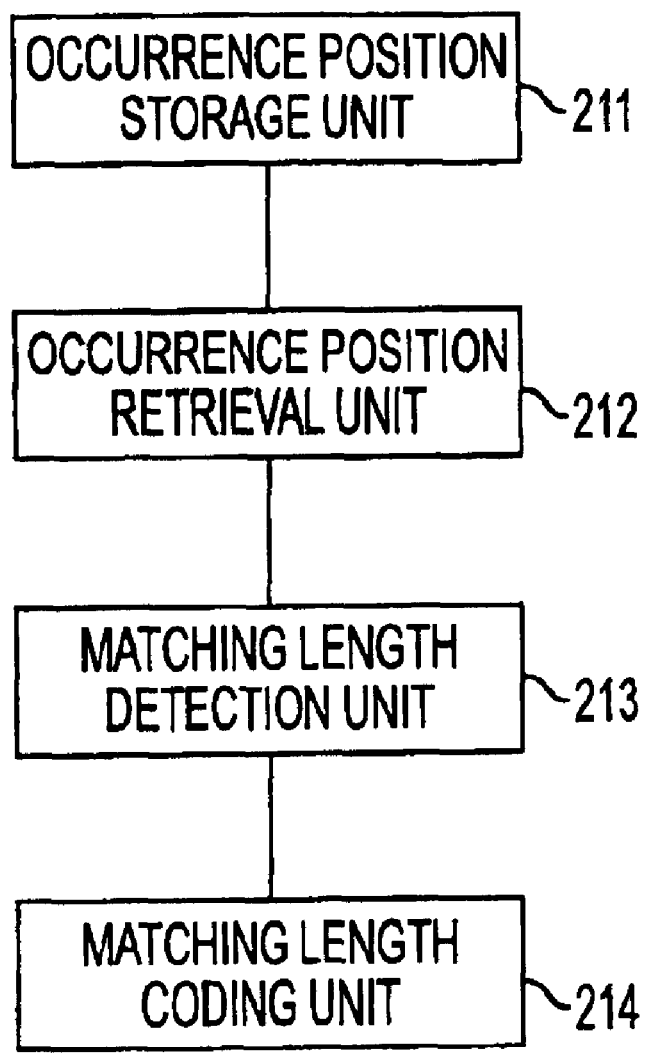
FIG. 18 is a block diagram of the configuration of the coding apparatus according to the eighth embodiment of the present invention.

FIG. 18 is a block diagram of the configuration of the coding apparatus according to the eighth embodiment of the present invention. According to the embodiment shown in FIG. 3, when the same symbol string occurred previously, the following symbol string is coded by a matching length code. In this case, the time taken in the coding process is mainly occupied by the retrieval of the occurrence position of the previous symbol string having the length of n. Therefore, in the eighth embodiment of the present invention, the occurrence position of a previous symbol string having the length of n is coded and stored, and then obtained based on the storage result. Thus, the time taken to retrieve the previous occurrence position of the symbol string having the length of n can be shortened.

In FIG. 18, an occurrence position storage unit 211 codes and stores the occurrence position of an input symbol string. An occurrence position retrieval unit 212 checks whether or not the code corresponding to the first symbol string having a predetermined length of n is stored in the occurrence position storage unit 211. If the code is stored, the occurrence position of the second symbol string associated with the code is obtained. It is not necessary that the first symbol string always matches the second symbol string. That is, the first symbol string can be different from the second symbol string if the occurrence position of the second symbol string can be specified from the first symbol string. However, a higher compression rate can be obtained when the first symbol string matches the second symbol string. That is, when the first symbol string matches the second symbol string, there is a higher probability that a longer matching length k can be obtained between the third symbol string following the first symbol string and the fourth symbol string following the second symbol string.

When the occurrence position of the second symbol string is detected, a matching length detection unit 213 detects the matching length k between the fourth symbol string and the third symbol string by comparing the fourth symbol string following the second symbol string with the third symbol string following the first symbol string. When the matching length k is detected, a matching length coding unit 214 codes the third symbol string based on the matching length k.

Figure 19:
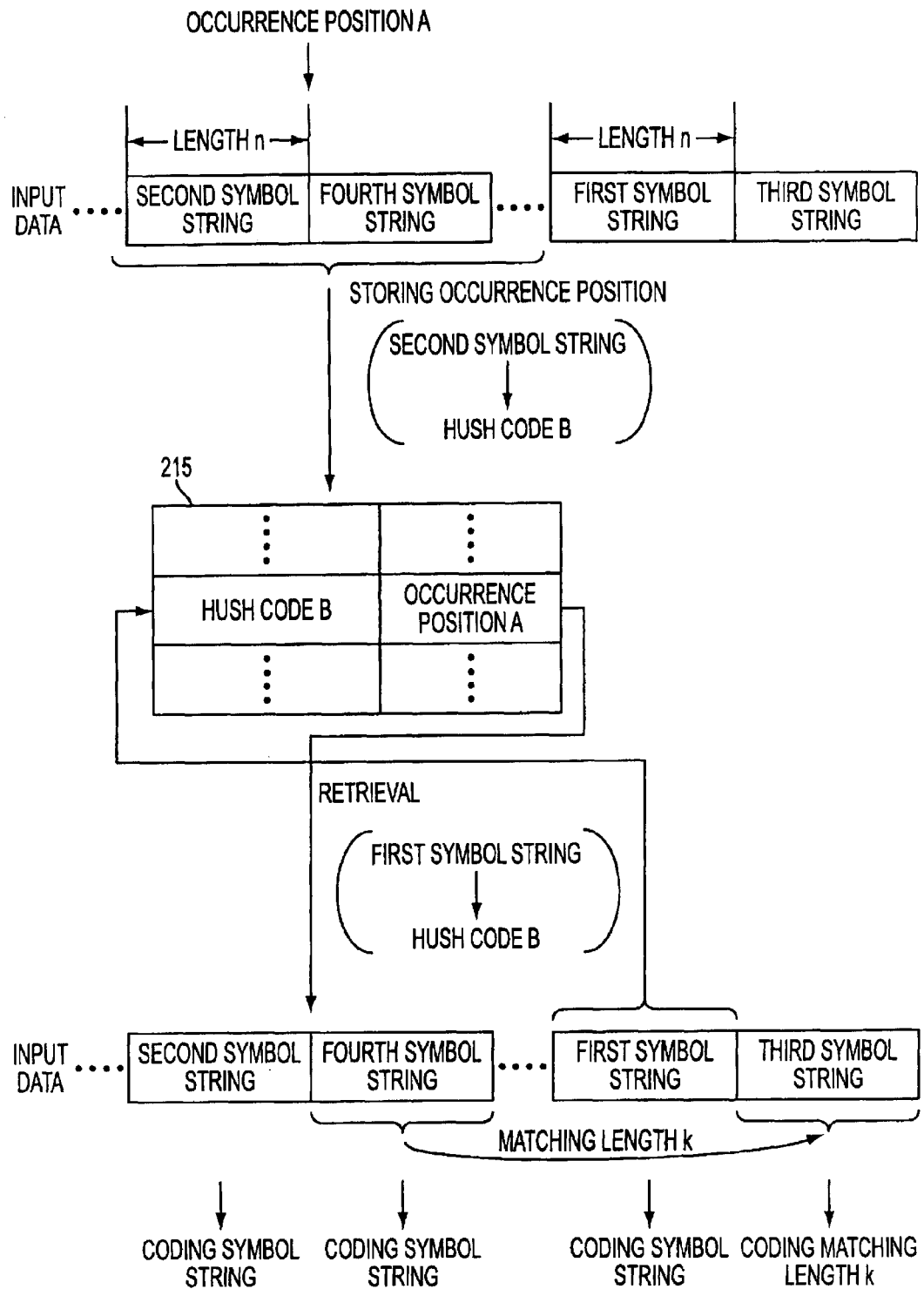
FIG. 19 shows the encoding method according to the eighth embodiment of the present invention.

FIG. 19 shows the coding method according to the eighth embodiment of the present invention.

In FIG. 19, when input data is entered, a hash code is assigned to the symbol string having the length n, and the occurrence position of the symbol string is stored in a storage unit 215. In this example, assume that a hash code B is assigned to the previous second symbol string having the length n, and the occurrence position A of the second symbol string is stored in the storage unit 215 corresponding to the hash code B.

Next, when the first symbol string having the length n is input, a hash code corresponding to the first symbol string is generated, and it is checked whether or not a hash code corresponding to the first symbol string is stored in the storage unit 215. Assume that a hash code B is assigned to the first symbol string, the occurrence position A stored corresponding to the hash code B is read from the storage unit 215. When the occurrence position A is obtained, a matching length k between the third symbol string following the first symbol string and the fourth symbol string at and after the occurrence position A is obtained, and the third symbol string is coded based on the matching length k.

The first and second symbol strings are used to specify the position of the fourth symbol string for use in coding the third symbol string based on the matching length k. Thus, the position of the fourth symbol string for use in coding the third symbol string based on the matching length k should be specified using the first and second symbol strings. Therefore, the first and second symbol strings do not always have to match each other.

Figure 20:
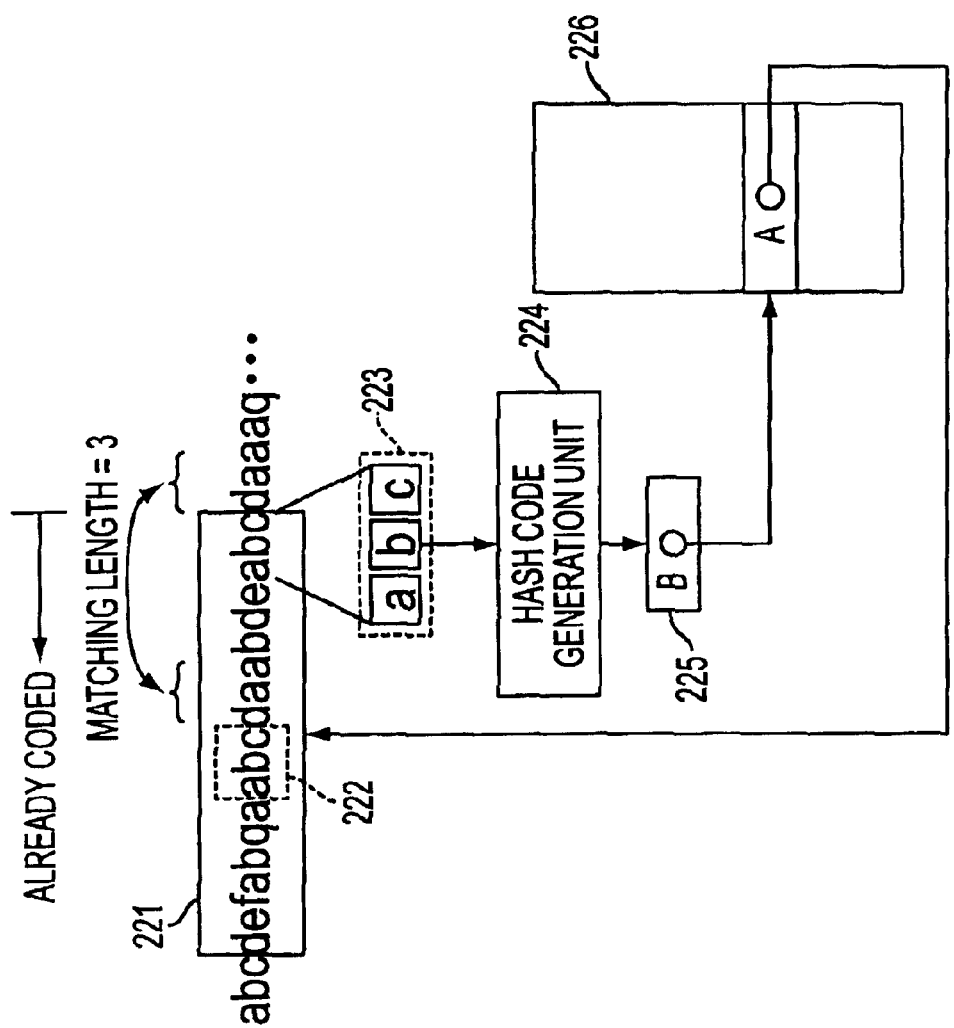
FIG. 20 shows the data compressing method according to the ninth embodiment of the present invention.

FIG. 20 shows the data compressing method according to the ninth embodiment of the present invention. In the ninth embodiment, a hash code is generated from the three characters immediately before the character string to be coded, and the occurrence position of the previous character string for use in comparison is obtained from the generated hash code.

Assume that a character string 'a b c d e f a b q a a b c d a a b d e a b c d a a a q . . . ' is input as data to be compressed, and the portion 'a b c d e f a b q a a b c d a a b d e a b c' has already been coded as shown in FIG. 20. In this case, a hash code is generated from the three characters in a window 221 in the already coded character string, and the occurrence position of the three-character strings is stored in a storage unit 226. For example, assume that, corresponding to a character string 222 'a b c', a hash code B is generated by a hash code generation unit 224, and an occurrence position A is stored in the storage unit 226 corresponding to the hash code B.

Next, to code the character string 'd a a a q . . . ' after the already coded character string, a 3-character string 223 'a b c' immediately before the character string 'd a a a q . . . ' to be coded is observed, and a hash code of the 3-character string 223 'a b c' is obtained. In this example, since the 3-character string 'a b c' is assigned the hash code B, the hash code B is generated as a hash code of the 3-character string 223 'a b c'.

Next, it is checked whether or not the hash code B is stored in the storage unit 226. If the hash code B is stored in the storage unit 226, then the occurrence position corresponding to the hash code B is obtained. In this example, since the hash code B has already been stored in the storage unit 226, the occurrence position A is obtained as the occurrence position of the previous 3-character string 222 corresponding to the 3-character string 223 'a b c'. When the occurrence position A is obtained, the character string 'd a a a q . . . ' to be coded is compared with the character string 'd a a b d e a b c' after the occurrence position A to obtain the matching length between these character strings. Since the 3-character strings 'd a a' match, the matching length is 3. When the matching length of 3 is obtained, the portion 'd a a' which is a character string to be coded is coded based on the matching length of 3.

Thus, the time required to retrieve the previous occurrence position of the character string 222 can be shortened by storing the previous occurrence position of the character string 222 in association with the hash code B, and obtaining the previous occurrence position of the character string 222 corresponding to the character string 223 through the hash retrieval.

In the hash retrieval, there are a plurality of character strings for which the same hash codes are allocated. That is, the character string at the previous occurrence position associated with a hash code can be different from the character string for which the hash code is originally generated (generating the same hash codes from different character strings is referred to as a conflict). Therefore, when the hash retrieval is performed, the original key is normally checked for matching. However, according to the embodiment, the hash retrieval is performed as a key for use in determining whether or not the subsequent character string is to be coded using a matching length code. Since the character string used in the hash retrieval is not contained in the matching length code, it is not necessary that the character string matches the original key. Therefore, the present invention improves the processing speed not only by the hash retrieval but also by omitting a matching check.

However, the compression rate is higher when the character string matches the original key. Therefore, a matching check can be made for the previous p characters. For example, the length n of the previous character string for use in generating a hash code can be 3 characters, and the length p of the previous character string for use in a matching check for a conflict in the hash can be 2 characters.

In addition, different hash codes can be assigned to different character strings to prevent a conflict.

Figure 21:
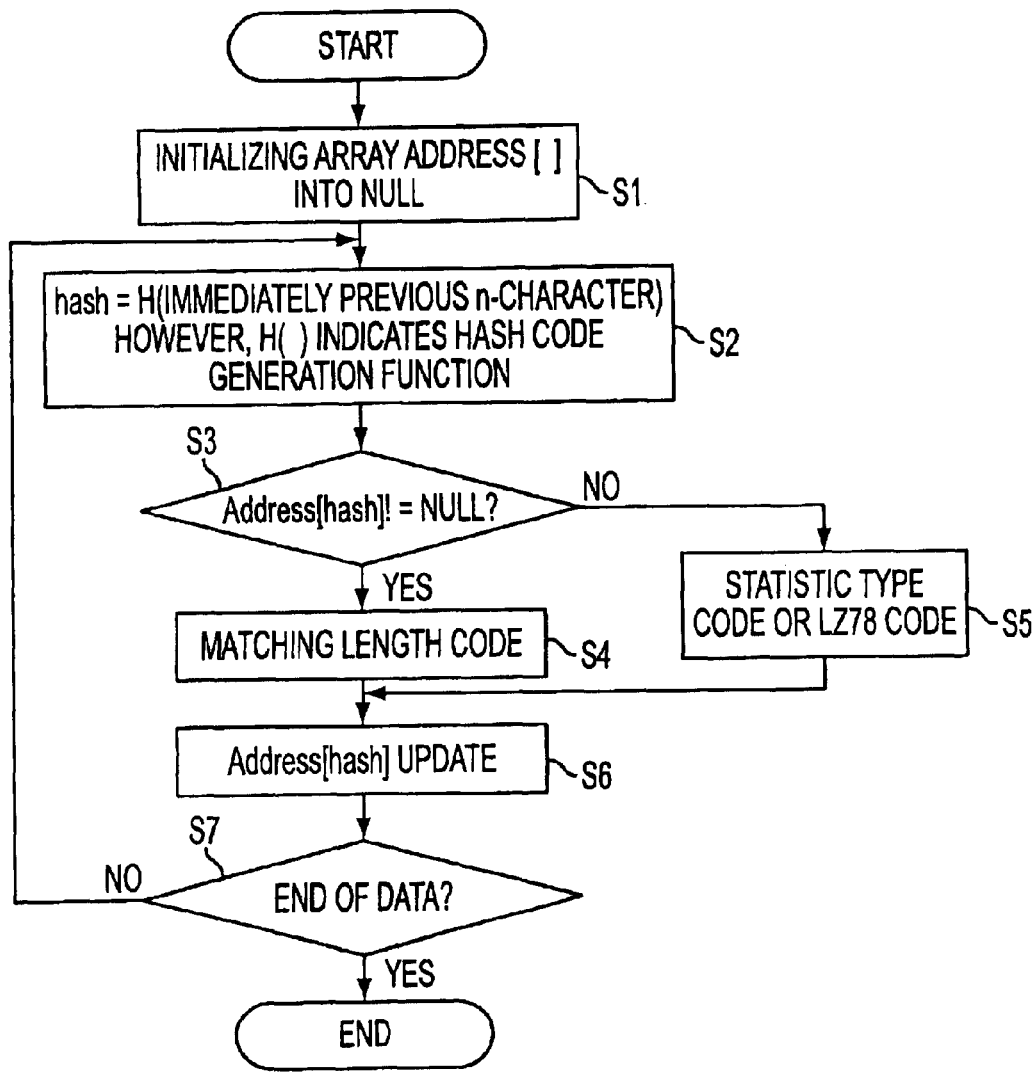
FIG. 21 is a flowchart of the data compressing method according to the tenth embodiment of the present invention.

FIG. 21 is a flowchart of the data compressing method according to the tenth embodiment of the present invention. According to the tenth embodiment of the present invention, the occurrence position of the previous character string corresponding to the character string to be coded based on a matching length is obtained by the hash retrieval. If the hash retrieval fails, the character string is coded by a statistic type code or an LZ78 code.

In FIG. 21, an array address at which the occurrence position of a previous n-character string is hash-coded and stored is initialized (step S1). Next, a hash code of the n-character string immediately before the character string to be coded is generated (step S2), and it is checked whether or not the occurrence position corresponding to the hash code is stored at the array address (step S3). If the occurrence position corresponding to the hash code is stored at the array address, then the occurrence position of the previous n-character string corresponding to the n-character string immediately before the character string to be coded is obtained from the array address. Then, the matching length of the character string after the n-character string is checked, and the character string to be coded is coded based on the matching length (step S4).

On the other hand, if the occurrence position corresponding to the hash code is not stored at an array address, then the character or the character string to be coded is coded by a statistic type code or an LZ78 code (step S5).

Then, corresponding to the hash code of the n-character string immediately before the coded character string, the occurrence position of the n-character string is stored at an array address (step S6). Then, it is determined whether or not the coding process has been completed to the end of the input data (step S7). If the coding process has not been completed, then control is returned to step S2, and the above described processes are repeated.

Thus, the time required to retrieve a character string can be shortened by hash-retrieving the occurrence position of the previous character string corresponding to the character string to be coded based on a matching length, thereby realizing a processing speed at a practical level.

Figure 22:
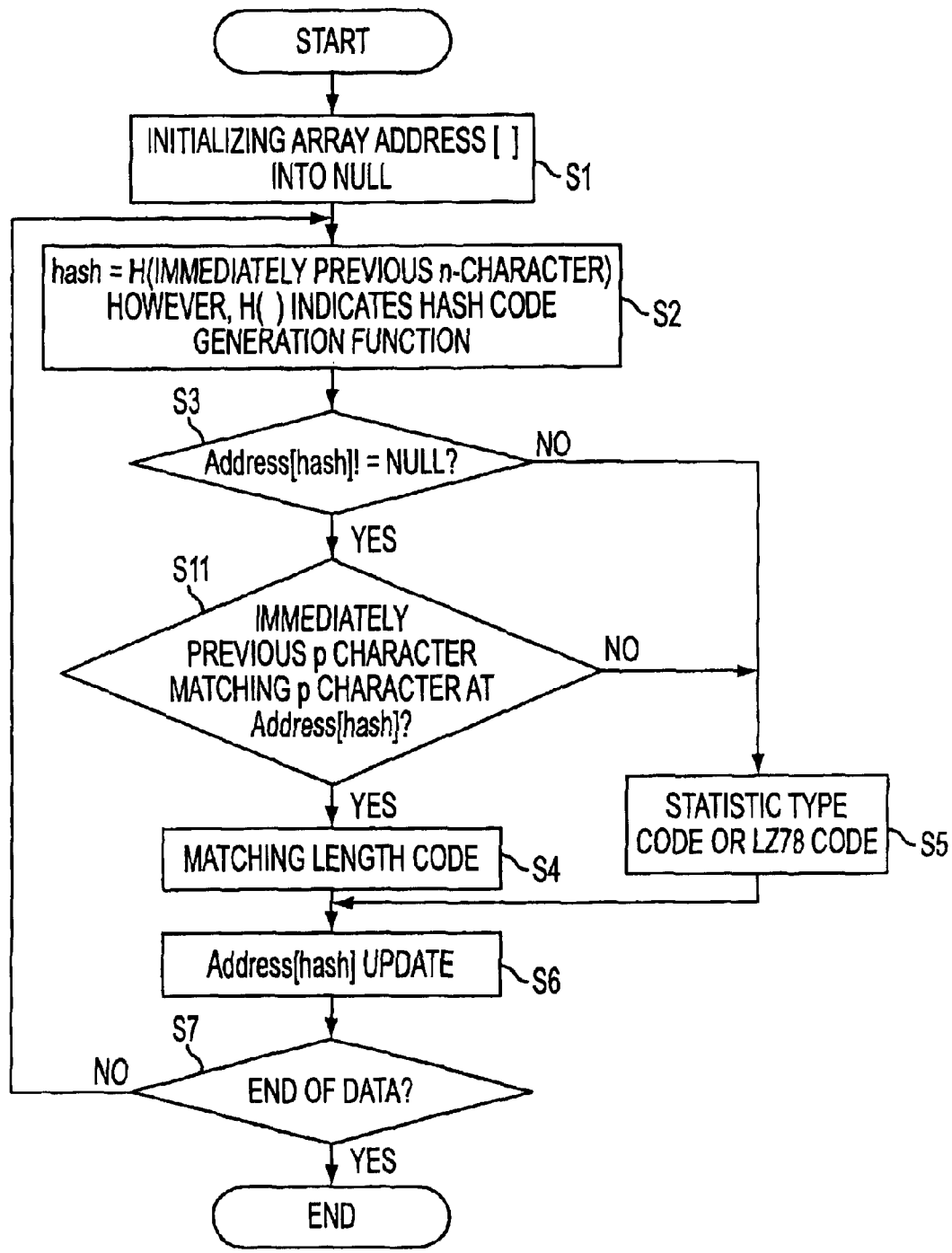
FIG. 22 is a flowchart of the data compressing method according to the eleventh embodiment of the present invention.

FIG. 22 is a flowchart of the data compressing method according to the eleventh embodiment of the present invention. According to the embodiment shown in FIG. 21, a coding process is performed based on a matching length without checking the matching between the n-character string immediately before the character string to be coded and the previous n-character string corresponding to the n-character string. However, according to the embodiment shown in FIG. 22, a matching check is made for the p characters immediately before the character string to be coded. Since the processes in steps S1 through S7 according to the embodiment shown in FIG. 22 are matching the processes according to the embodiment shown in FIG. 21, the descriptions are omitted here, and only the portions different from those in the embodiment shown in FIG. 21 are described below.

In FIG. 22, when the hash code of the n-character string immediately before the character string to be coded is stored at an array address (step S3), it is checked whether or not the p-character string immediately before the character string to be coded matches the previous p-character string at the occurrence position retrieved by the hash retrieval (step S11). Then, if the p-character string immediately before the character string to be coded matches the previous p-character string at the occurrence position retrieved by the hash retrieval, then the character string to be coded is coded based on a matching length (step S4). On the other hand, if the p-character string immediately before the character string to be coded does not match the previous p-character string at the occurrence position retrieved by the hash retrieval, then the character or the character string to be coded is coded by a statistic type code or an LZ78 code (step S5).

Thus, a previous character having a longer matching length can be retrieved by performing a matching check between a character string for retrieval for use in performing a coding process based on a matching length and a previous character string. As a result, a compression rate can be successfully improved.

It is desired that n is set to 3, and p is set to 2. By setting these values, the retrieval time can be prevented from being prolonged with the compression rate improved.

Figure 23:
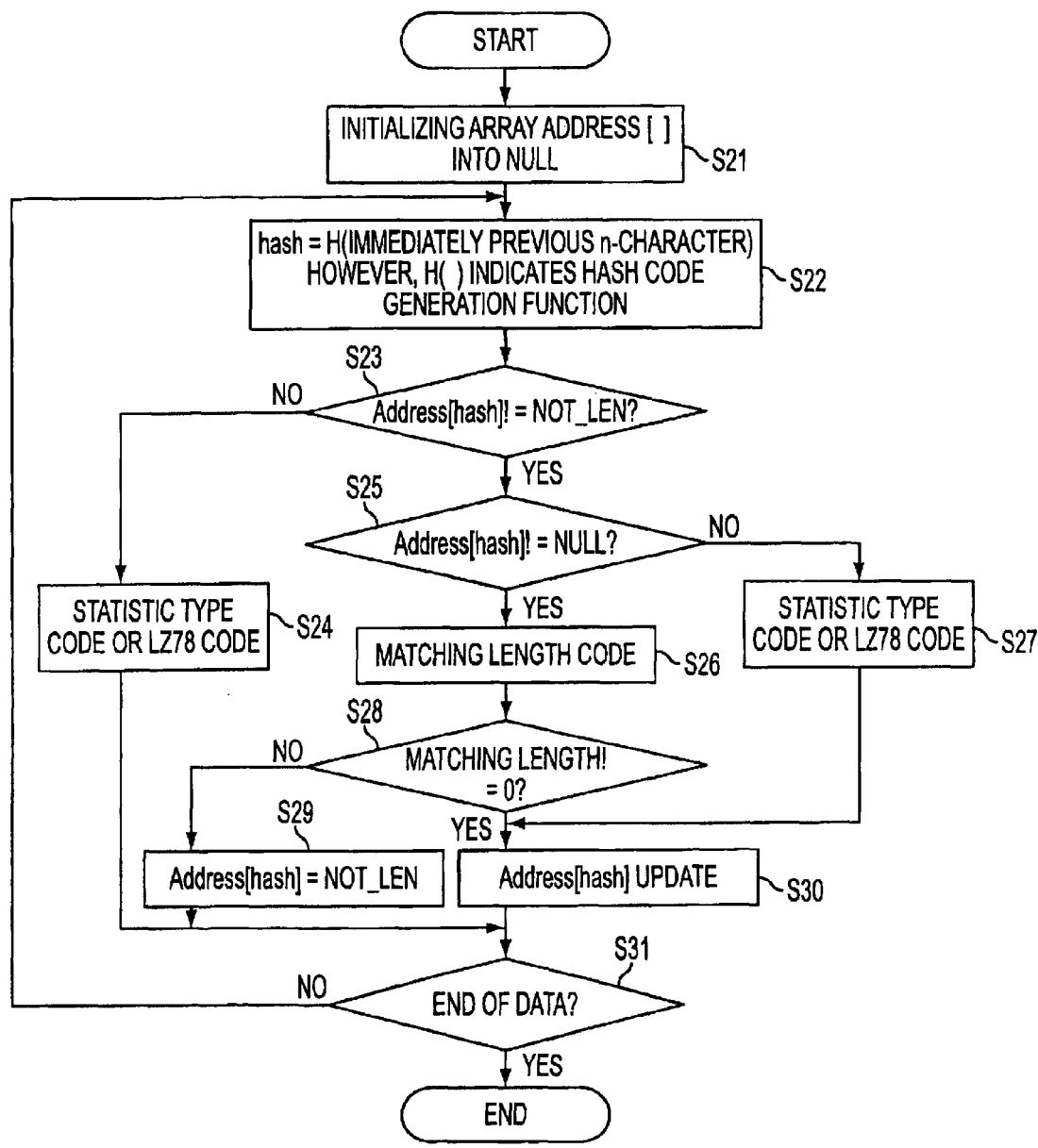
FIG. 23 is a flowchart of the data compressing method according to the twelfth embodiment of the present invention.

FIG. 23 is a flowchart of the data compressing method according to the twelfth embodiment of the present invention. In the above described embodiment, a previous character string is searched for using n-character string immediately before the character string to be coded, and the portion matching the previous character string is coded based on a matching length. However, when the length of a large number of repeated character strings is n, a code indicating the matching length of 0 is frequently added, thereby lowering the compression rate. Accordingly, in the embodiment shown in FIG. 23, when the character string following the n-character string used in retrieving the previous character string does not match the previous character string (in this case, the matching length=0), the next occurrence of the character string does not imply the coding based on the matching length. Therefore, a code indicating the matching length of 0 is prevented from being added, thereby preventing the compression rate from being lowered.

In FIG. 23, the array address at which the occurrence position of the previous n-character string is stored after being hash-coded (step S21), and the hash code of the n-character string immediately before the character string to be coded is generated (step S22). Then, it is checked whether or not the contents of the array address specified by the hash code are 'NOT_LEN'. If the contents of the array address is 'NOT_LEN', then the character or the character string to be coded is coded by a statistic type code or an LZ78 code (step S24). On the other hand, when the contents of the array address are not 'NOT_LEN', it is checked whether or not the occurrence position corresponding to the hash code is stored at the array address (step S25). When the occurrence position corresponding to the hash code is stored at the array address, the occurrence position of the previous n-character string corresponding to the n-character string immediately before the character string to be coded is obtained from the array address. Then, the matching length of the character string after the n-character strings is checked, and the character string to be coded is coded based on the matching length (step S26).

On the other hand, the occurrence position corresponding to the hash code is not stored at the array address, the character or the character string to be coded is coded by a statistic type code or an LZ78 code (step S27).

Next, it is checked whether or not the matching length computed in step S26 is 0 (step S28). If the matching length is 0, then 'NOT_LEN' is stored at the array address specified by the hash code (step S29). On the other hand, if the matching length is not 0, then the occurrence position of the n-character string is stored at the array address specified by the hash code (step S30). Next, it is determined whether or not the coding process has been completed to the end of the input data (step S31). If the coding process has not been completed, control is returned to step S22, and the above described process is repeated.

In the above described embodiment, the coding process is not performed only when the matching length is 0, but the matching length can be any other values than 0.

In addition, when it is determined whether or not the matching length between the current character string and the previous character string indicates a value larger than a predetermined value. If the matching length between the current character string and the previous character string indicates a value larger than a predetermined value, the coding process is performed using an LZ77 code. If it indicates a value smaller than a predetermined value, the coding process is performed using an LZ78 code or a probability statistic type code.

Figure 24:
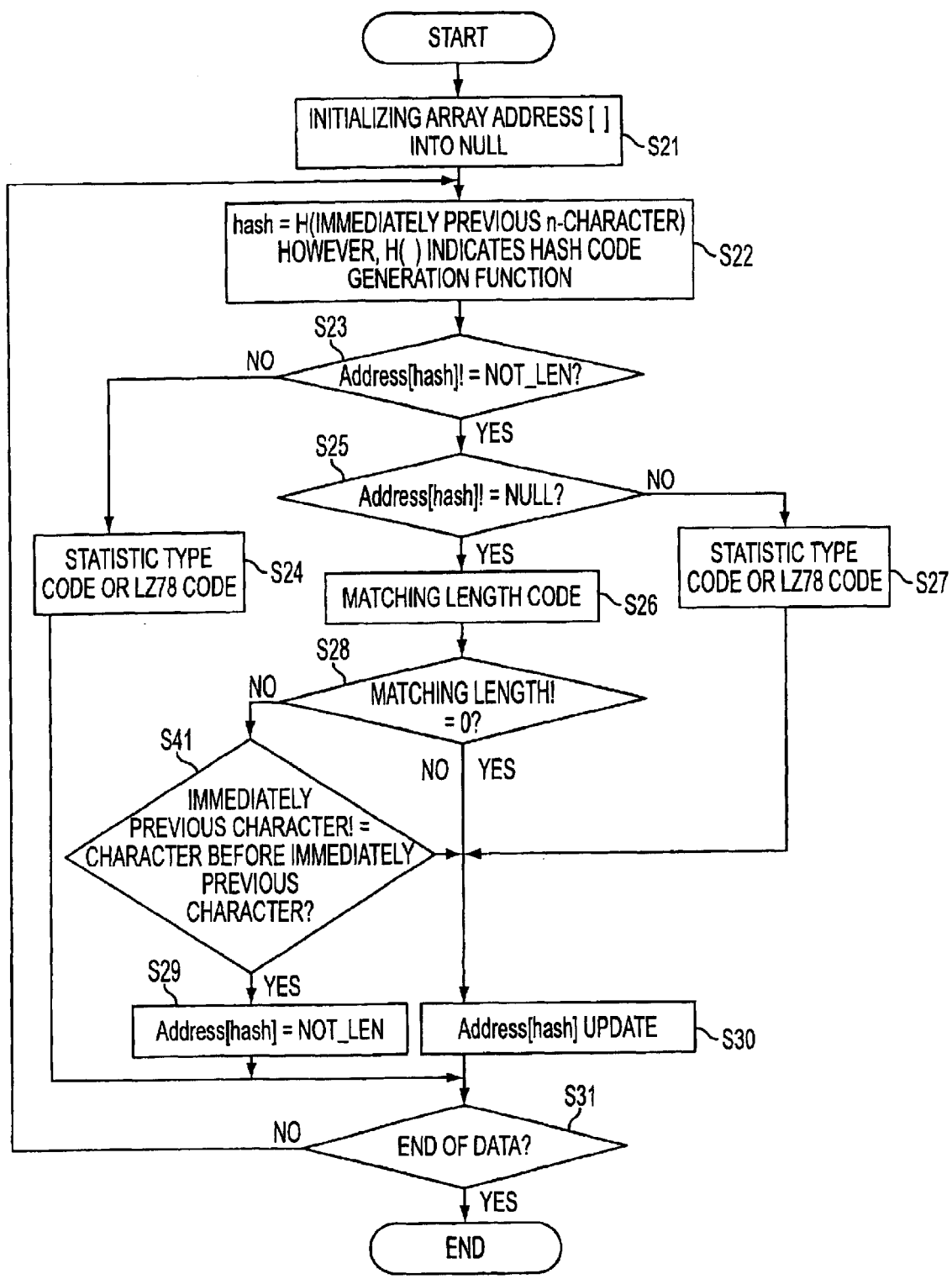
FIG. 24 is a flowchart of the data compressing method according to the thirteenth embodiment of the present invention.

FIG. 24 is a flowchart of the data compressing method according to the thirteenth embodiment of the present invention. According to the embodiment shown in FIG. 23, when the matching length after the n-character string is 0, the subsequent character string is not coded based on a matching length even if the n-character string occurs next. However, it is recommendable that the coding process based on a matching length is not limited for data which possibly contains a large number of repetitions of the same characters (for example, '0000', 'FFFF', etc.). Therefore, according to the embodiment shown in FIG. 24, when an immediately previous character string contains a repetition of the same characters, switching into a matching length code is not limited. Thus, the compression rate can be improved for data which possibly contains a large number of repetitions of the same characters. Since the processes in steps S21 through S31 shown in FIG. 24 are the same as those according to the embodiment shown in FIG. 23, the detailed descriptions are omitted here, and only the portions different from those according to the embodiment shown in FIG. 23 are described below.

In FIG. 24, when it is determined that a matching length is 0 in step S28, it is checked whether or not the character immediately before the character string to be coded matches the character before it (step S41). If they do not match each other, 'NOT_LEN' is stored at the array address specified by the hash code of the character string (step S29). On the other hand, if they match each other, the occurrence position of the n-character string is stored at the array address specified by the hash code of the character string (step S30).

According to the embodiment shown in FIG. 24, when an immediately previous character string having the length of 2 contains a repetition of the same characters, no switching into a matching length code is performed. The character string immediately before can have the length of 2 or larger.

Figure 25:
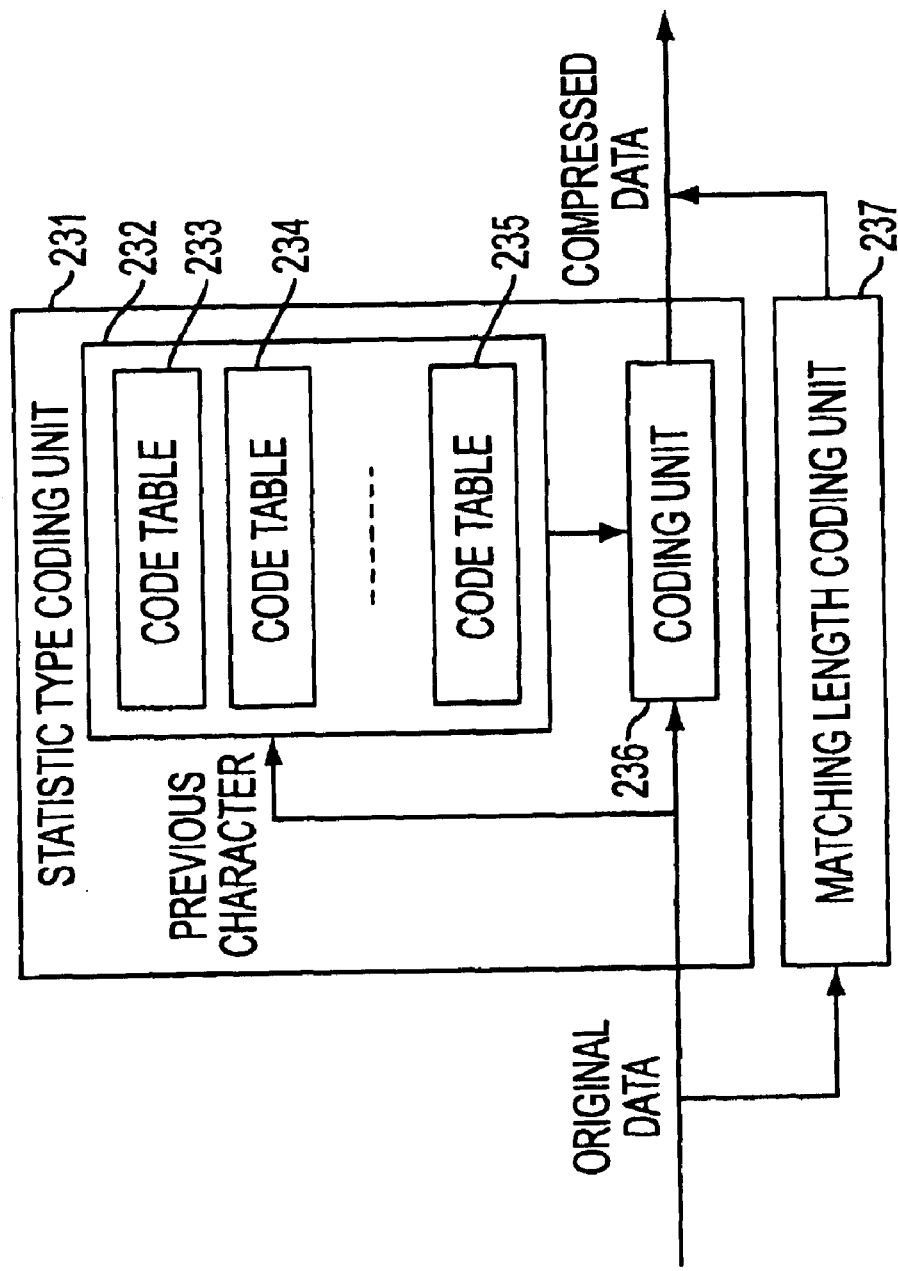
FIG. 25 is a block diagram of the configuration of the data compression apparatus according to the fourteenth embodiment of the present invention.

FIG. 25 is a block diagram of the configuration of the data compressing apparatus according to the fourteenth embodiment of the present invention. Normally, when data is compressed by the probability statistic type coding system, the highest compression rate can be obtained using a character string having the length of 5 as the maximum context (referred to, as a 5th context) (refer to, for example, the above described document "Unbounded Length Contexts for PPM"). However, the 5th context makes a slow process. Therefore, a coding process is performed with a matching length code combined with the probability statistic type coding system of the fixed primary context according to the embodiment shown in FIG. 25. By combining a matching length code with the probability statistic type coding system of the fixed primary context, a high compression rate can be obtained even if the process is simplified by limiting a compression target in the probability statistic type coding system to a short character string of two- or three-character string. In addition, as compared with the coding process using only a 5th context, the combination can furthermore improve the process speed.

A statistic type coding unit 231 and a matching length coding unit 237 are provided as shown in FIG. 25. The statistic type coding unit 231 performs a coding process using a fixed primary context, and 256 code tables 233 through 235 corresponding to an immediately previous character are held in a code table holding unit 232.

The original data is input to the statistic type coding unit 231 and the matching length coding unit 237. When the original data is input, the statistic type coding unit 231 selects the code tables 233 through 235 corresponding to the character immediately before the input character string. A coding unit 236 codes the character string using the code entered in the selected code tables 233 through 235, and outputs the coding result. When the original data is entered, the matching length coding unit 237 codes the input character string based on a matching length, and outputs the coding result.

In the example shown in FIG. 25, the code tables 233 through 235 are provided corresponding to all 1-byte characters of 256 types. However, the number of code tables can be reduced by providing code tables corresponding to the features extracted from the immediately previous character. For example, a code table can be provided corresponding to, excluding the highest order bit of the character data, the remaining 7 bits of the character data.

Figure 26:
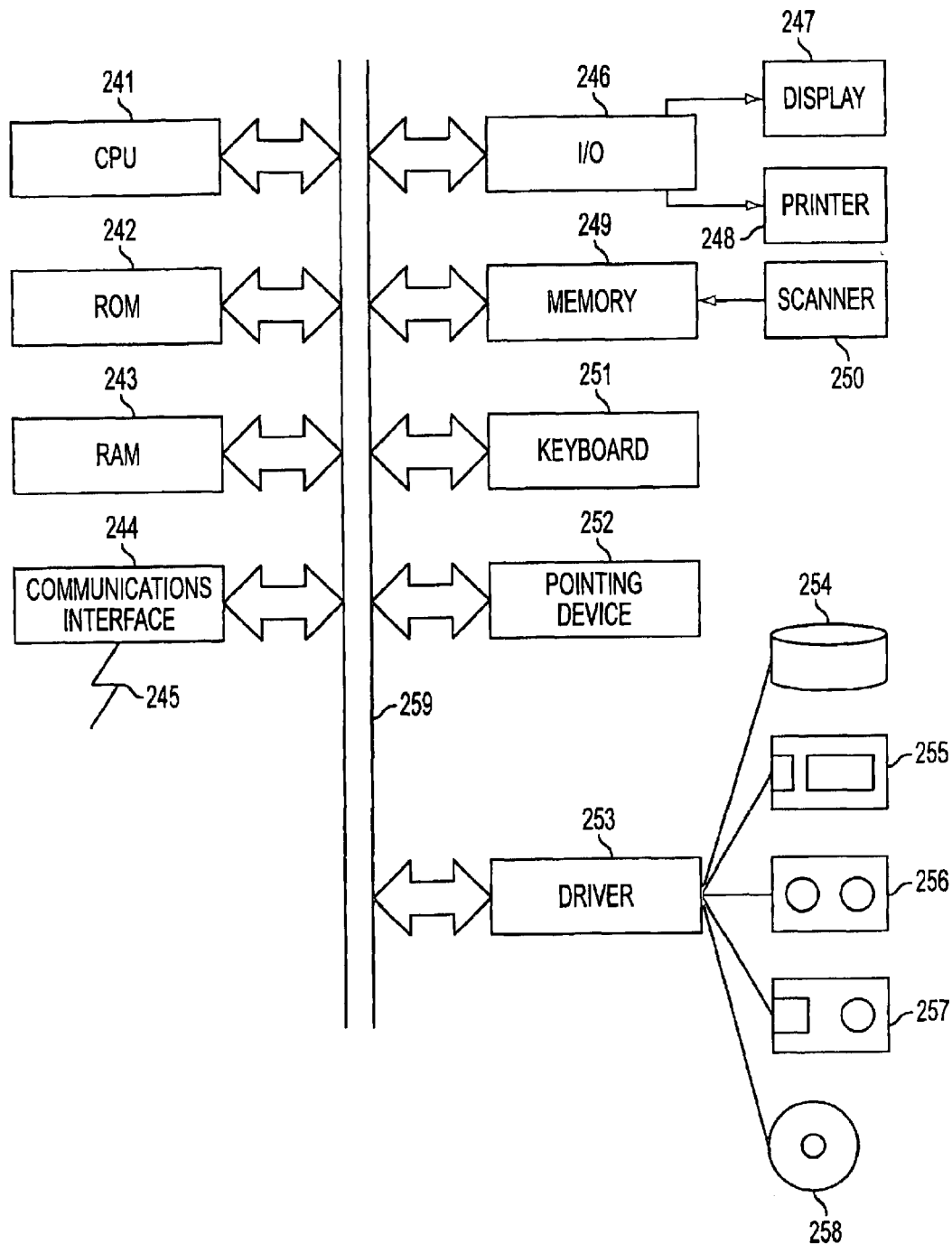
FIG. 26 is a block diagram of the system configuration of the coding apparatus and the decoding apparatus according to an embodiment of the present invention.

FIG. 26 is a block diagram of the system configuration of the coding apparatus and decoding apparatus (or the data compression apparatus and the data reconstruction apparatus) according to an embodiment of the present invention.

In FIG. 26, a central processing unit (CPU) 241 performs a general process, 242 is read-only memory (ROM), 243 is random access memory (RAM), 244 is a communications interface, 245 is a communications network, 246 is an input/output interface, a display 247 displays document data, etc., a printer 248 prints document data, etc., memory 249 temporarily stores document data, etc. read by a scanner 250 for reading an input image, etc., 251 is a keyboard, 252 is a pointing device such as a mouse, a driver 253 drives a storage medium, 254 is a hard disk, 255 is an IC memory card, 256 is a magnetic tape, 257 is a floppy disk, 258 is an optical disk such as CD-ROM, DVD-ROM, etc., and 259 is a bus.

A program for compressing data, a program for reconstructing data, data to be compresses, compressed data, etc. are stored in storage media such as the hard disk 254, the IC memory card 255, the magnetic tape 256, the floppy disk 257, the optical disk 258, etc. Data can be compressed by reading a program for compressing data, and data to be compressed from these storage media to the RAM 243. In addition, data can be reconstructed by reading a program for reconstructing data, and data to be compressed from these storage media to the RAM 243. Furthermore, a program for compressing data and a program for reconstructing data can be stored in the ROM 242.

Furthermore, a program for compressing data, a program for reconstructing data, data to be compressed, compressed data, etc. can be retrieved from the communications network 245 through the communications interface 244. The communications network 245 connected to the communications interface 244 can be, for example, a LAN (local area network), a WAN (wide area network), Internet, an analog telephone network, a digital telephone network (ISDN: integral service digital network), a PHS (personal handy system), wireless communications networks such as satellite communications, etc.

When a program for compressing data is activated, the central processing unit 241 obtains data to be compressed from a storage medium such as the hard disk 254 or the communications network 245, etc. The obtained data to be compressed is compressed by the method shown in FIGS. 4, 7, 10, 20 through 24, etc. The compressed data is stored in a storage medium such as the hard disk 254, etc., and transmitted through the communications network 245.

By compressing data, the storage capacity can be reduced when data is stored in a storage medium such as the hard disk 254, or the transmission time can be shortened when data is transmitted through the communications network 245.

In addition, a compressing time can be shortened by hash-coding and storing a symbol string which previously occurred in the RAM 243, and by performing hash retrieval to search for the previous symbol string to be referred to when a coding process is performed based on a matching length.

Furthermore, when a program for reconstructing data is activated, the central processing unit 241 obtains compressed data from a storage medium such as the hard disk 254, etc. or the communications network 245, etc. Then, the obtained compressed data is reconstructed, and the reconstructed data is stored in a storage medium such as the hard disk 254, etc., transmitted through the communications network 245, displayed on the display 247, and printed on the printer 248.

Thus, according to the present invention, a part of matching symbol string can be coded based on the matching length. Accordingly, the input data having a repetition of long symbol strings can be efficiently compressed. In addition, since a remaining portion of a matching symbol string is used as a code for use in detecting a matching position, the matching position can be detected without newly inserting a code for use in detecting the matching position. As a result, even when input data having a repetition of short symbol strings is coded using a matching length, the deterioration of a compression rate can be prevented from being caused by a large number of new codes inserted for detection of a matching position.

According to another aspect of the present invention, a part of a matching symbol string is coded based on a matching length while a portion not coded based on the matching length is coded using the code of a symbol occurring next when a previous symbol string is a context. As a result, for input data having a repetition of long symbol strings, a matching symbol string can be coded based on a matching string. Input data having a repetition of short symbol strings can be coded by allotting a shorter code length to a symbol string having a higher occurrence probability. As a result, a high compression rate can be attained for both data having a repetition of long symbol strings and data having a repetition of short symbol strings.

According to a further aspect of the present invention, a part of a matching symbol string is coded based on a matching length, and a portion not coded based on the matching length is coded by retrieving a coded word corresponding to the current symbol string from the dictionary in which the symbol strings occurred previously are entered in association with coded words. Thus, for input data having a repetition of long symbol strings, a matching symbol string can be coded based on a matching string, and input data having a repetition of short symbol strings can be coded by the LZ78 system. As a result, a high compression rate can be attained for both data having a repetition of long symbol strings and data having a repetition of short symbol strings.

According to a further aspect of the present invention, a part of a matching symbol string is coded based on a matching length, and the data coded based on the matching length is further coded using the code of a symbol occurring next when a previous symbol string is a context. Thus, for input data having a repetition of long symbol strings, a matching symbol string can be coded based on the matching length. Accordingly, the input data having a repetition of long symbol strings can be efficiently compressed. In addition, when a short symbol string repeatedly occurs in the compressed data, the compressed data can be furthermore compressed by allotting a short code length to a symbol string having a high occurrence probability, thereby attaining a high compression rate.

According to a further aspect of the present invention, a part of a matching symbol string is coded based on a matching length, and the coded data is further coded by retrieving a coded word corresponding to the current symbol string from the dictionary in which the symbol strings occurred previously are entered in association with coded words. Thus, for input data having a repetition of long symbol strings, a matching symbol string can be coded based on the matching length. Accordingly, the input data having a repetition of long symbol strings can be efficiently compressed. In addition, the compressed data can be further compressed by the LZ78 system. Therefore, a high compression rate can be attained for both data having a repetition of long symbol strings and data having a repetition of short symbol strings.

According to a further aspect of the present invention, by storing the occurrence position of a symbol string to be used in retrieval for checking the occurrence position of a previous symbol string to be compared based on a matching length, it is not necessary to check back one by one the previous symbol strings until a matching symbol string can be detected, thereby performing a coding process and a decoding process based on a matching length at a higher speed.

According to a further aspect of the present invention, when a matching length is shorter than a predetermined value, the symbol string is not coded based on the matching length. Thus, when a matching length is short, the deterioration of a compression rate caused by performing a coding process can be successfully avoided, thereby improving the compression rate in a coding process.

What is claimed is:

1. A data compressing apparatus having an input buffer for holding a string of data to be compressed, said input buffer comprising a Lempel buffer for storing an already compressed portion and a Ziv buffer for storing a portion to be compressed, comprising:

hash code generation means for generating a hash code from a character string having the length n;

occurrence position holding means for holding an occurrence position of the n-character string in the Lempel buffer in association with the hash code generated from the n-character string in the Lempel buffer;

occurrence position obtaining means for obtaining an occurrence position associated with the hash code from said occurrence position holding means by retrieving the hash code generated from the character string having the length n immediately before the Ziv buffer from said occurrence position holding means;

matching length obtaining means for comparing a character string after the occurrence position with a character string after a start of the Ziv buffer, and obtaining a matching length; and matching length coding means for coding the character string after the start of the Ziv buffer based on the matching length.

2. The apparatus according to claim 1, further comprising:

hash conflict confirmation means for comparing a character string in the Lempel buffer specified by said occurrence position obtaining means with a character string having the length p immediately before the Ziv buffer, wherein said matching length coding means codes a character string after a start of the Ziv buffer based on the matching length only when all of p characters match the character string.

3. The apparatus according to claim 2, wherein n=3 and p=0 or 2.

4. A data compressing apparatus having an input buffer for holding a string of data to be compressed, said input buffer comprising a Lempel buffer for storing an already compressed portion and a Ziv buffer for storing a portion to be compressed, comprising:

occurrence position holding means for holding a part or all of an occurrence position of a character string having a length n in the Lempel buffer;

occurrence/non-occurrence check means for checking whether or not an occurrence position in the Lempel buffer of a character string matching a character string having a length n immediately before the Ziv buffer is held;

occurrence position obtaining means for obtaining an occurrence position in the Lempel buffer of a character string matching an n-character string immediately before the Ziv buffer;

matching length obtaining means for comparing for matching a character string after the occurrence position with a character string after a start of the Ziv buffer, and obtaining a matching length;

non-matching information holding means for holding non-matching information in association with the n-character string when a matching length obtained by said matching length obtaining means is 0; and matching length coding means for coding the character string after the start of the Ziv buffer based on the matching length when the non-matching information is not associated with the character string having the length n immediately before the Ziv buffer.

5. The apparatus according to claim 4, further comprising:

same character sequence confirmation means for confirming whether or not all of characters in a character string having a length q immediately before the Ziv buffer are same characters, wherein when the all characters in the immediately previous character string having the length q are identical, said non-matching information holding means does not set the non-matching information for the n-character string even when the matching length is 0.

6. The apparatus according to claim 5, wherein q equals 2.

* * * * *